(12) United States Patent
Sung

(10) Patent No.: US 12,080,825 B2
(45) Date of Patent: Sep. 3, 2024

(54) METHOD FOR MANUFACTURING DISPLAY DEVICE USING SEMICONDUCTOR LIGHT EMITTING DEVICE

(71) Applicant: LG ELECTRONICS INC., Seoul (KR)

(72) Inventor: Junho Sung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 415 days.

(21) Appl. No.: 17/627,069

(22) PCT Filed: Jul. 26, 2019

(86) PCT No.: PCT/KR2019/009308
§ 371 (c)(1),
(2) Date: Jan. 13, 2022

(87) PCT Pub. No.: WO2021/020594
PCT Pub. Date: Feb. 4, 2021

(65) Prior Publication Data
US 2022/0254951 A1 Aug. 11, 2022

(51) Int. Cl.
*H01L 33/00* (2010.01)
*H01L 25/075* (2006.01)

(52) U.S. Cl.
CPC ...... *H01L 33/0093* (2020.05); *H01L 25/0753* (2013.01); *H01L 33/0095* (2013.01); *H01L 2933/0066* (2013.01)

(58) Field of Classification Search
None
See application file for complete search history.

(56) References Cited

U.S. PATENT DOCUMENTS

| | | | |
|---|---|---|---|
| 8,419,962 | B2 | 4/2013 | Nakagawa |
| 2002/0005294 | A1 | 1/2002 | Mayer et al. |
| 2005/0009303 | A1 | 1/2005 | Schatz |
| 2008/0023435 | A1 | 1/2008 | Wu et al. |
| 2011/0277917 | A1* | 11/2011 | Nakagawa ...... H01L 24/95 156/150 |
| 2015/0050761 | A1 | 2/2015 | Karlicek et al. |
| 2018/0166429 | A1 | 6/2018 | Chong et al. |
| 2018/0254395 | A1 | 9/2018 | Bedell et al. |

FOREIGN PATENT DOCUMENTS

| | | |
|---|---|---|
| JP | 2012512522 | 5/2012 |
| KR | 1020150005628 | 1/2015 |
| KR | 101620469 | 5/2016 |
| KR | 20200026693 | 3/2020 |

OTHER PUBLICATIONS

PCT International Application No. PCT/KR2019/009308, International Search Report dated Apr. 24, 2020, 4 pages.
European Patent Office Application Serial No. 19939844.7, Extended Search Report dated Mar. 15, 2023, 8 pages.

* cited by examiner

*Primary Examiner* — Robert K Carpenter
(74) *Attorney, Agent, or Firm* — LEE, HONG, DEGERMAN, KANG & WAIMEY

(57) ABSTRACT

The present disclosure relates to a method for manufacturing a display device capable of transferring semiconductor light emitting diodes formed at predetermined intervals on a growth substrate to a wiring board or an assembly board while maintaining the intervals when the semiconductor light emitting diodes are transferred from the growth substrate to the assembly board by self-assembly.

11 Claims, 31 Drawing Sheets

[FIG. 1]
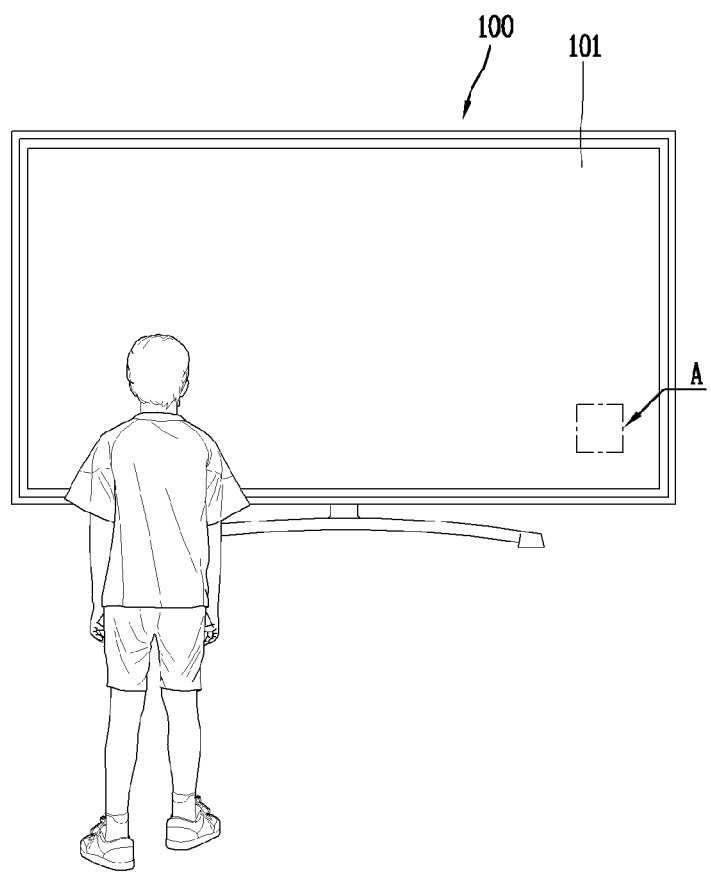

【FIG. 2】
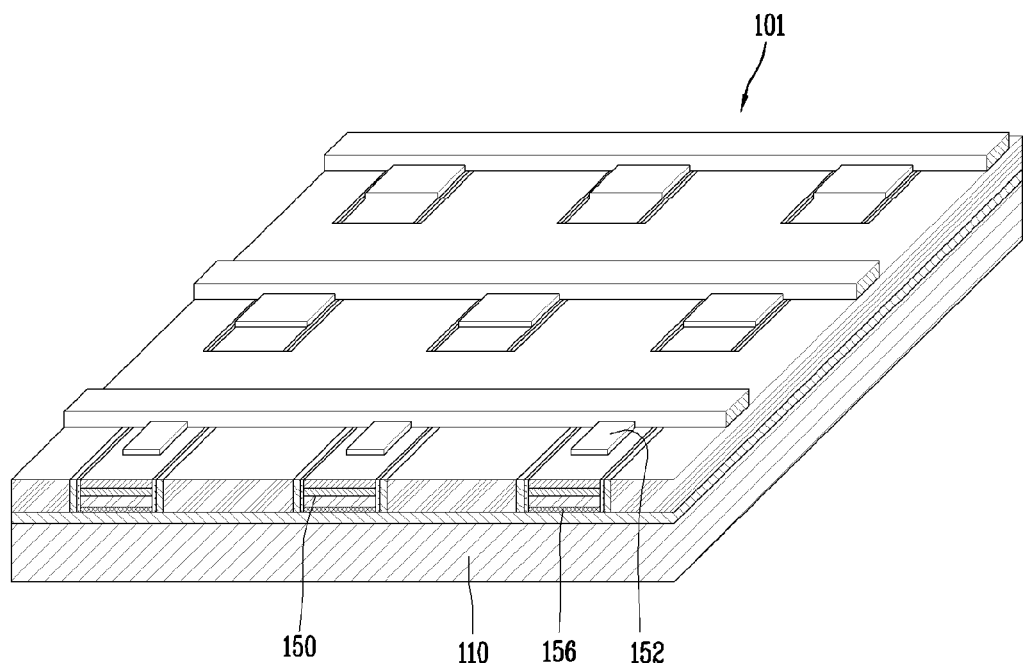

【FIG. 3】
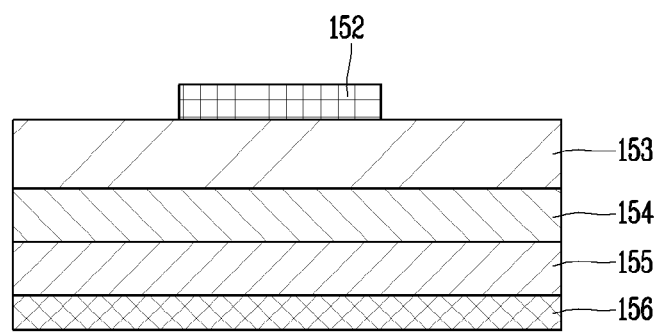
【FIG. 4】
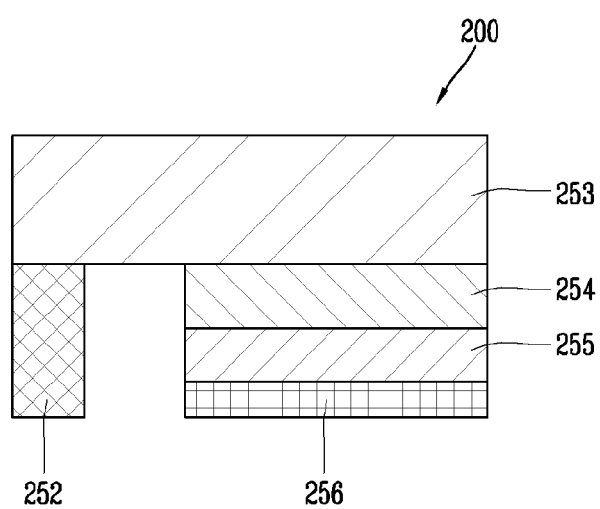

【FIG. 5a】
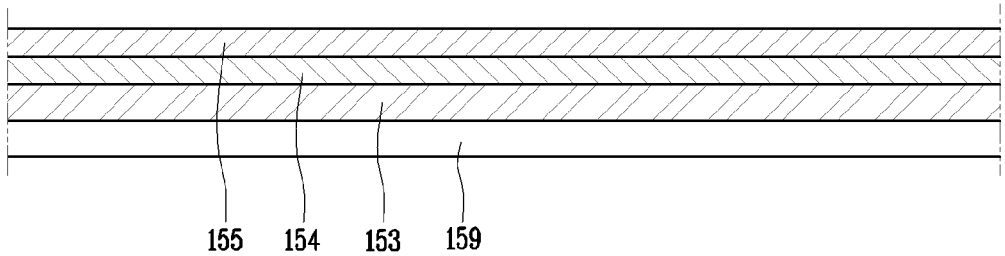
【FIG. 5b】
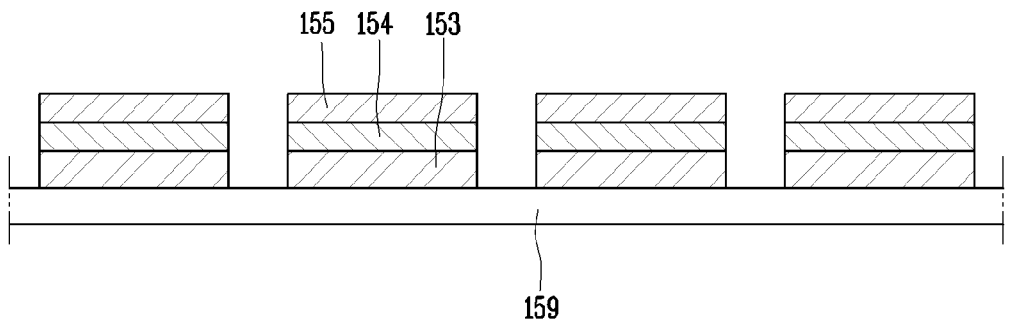
【FIG. 5c】
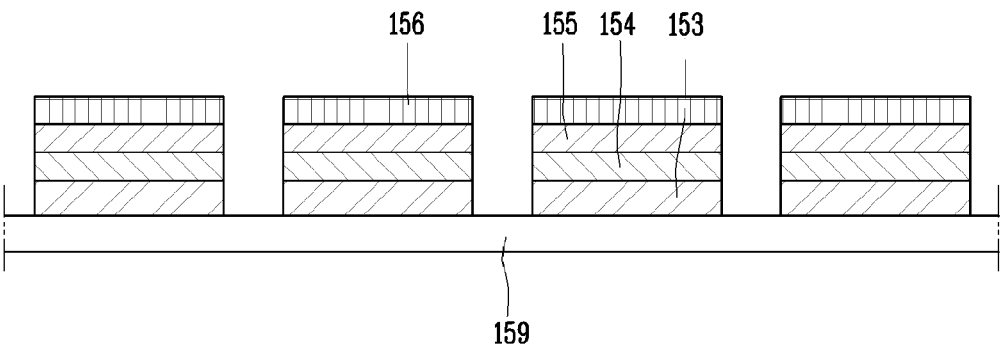

【FIG. 5d】
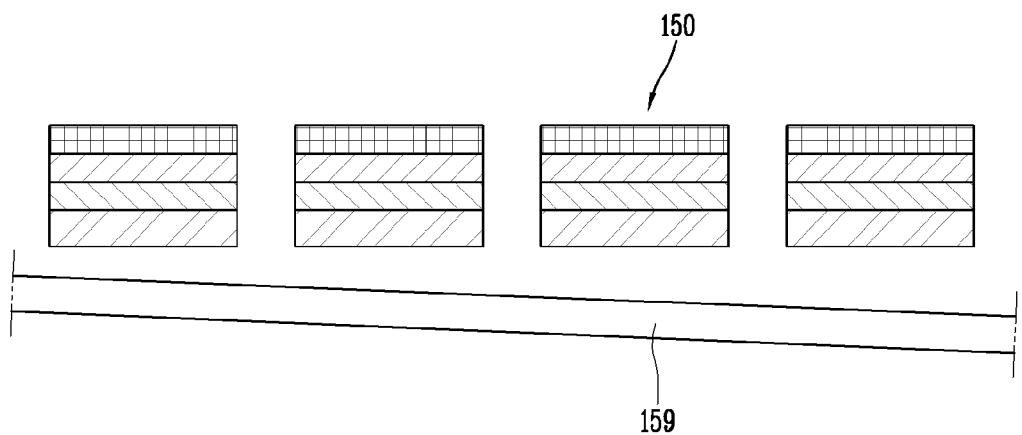
【FIG. 5e】
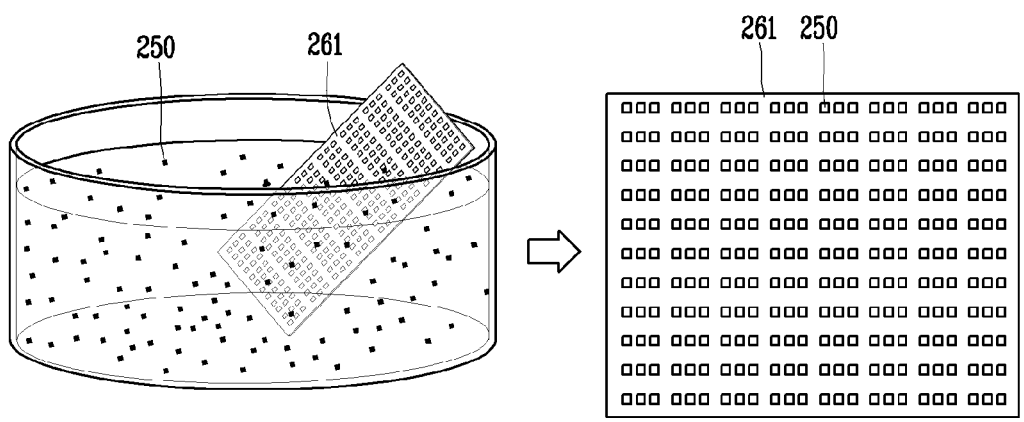

【FIG. 6】
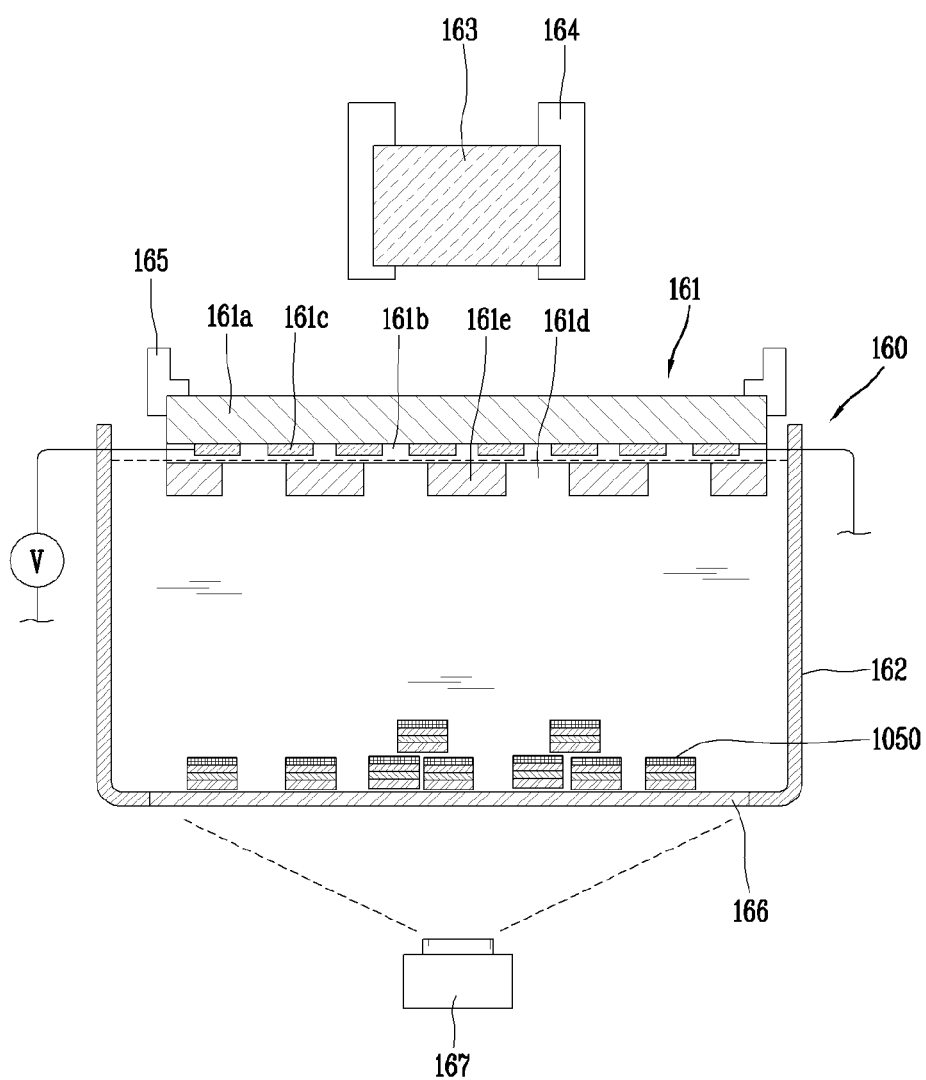

[FIG. 7]
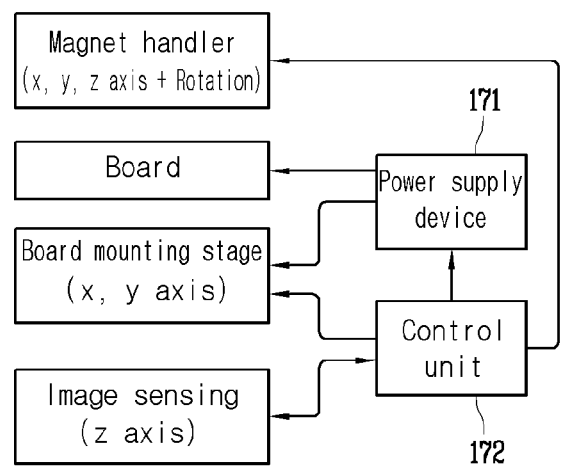

【FIG. 8a】
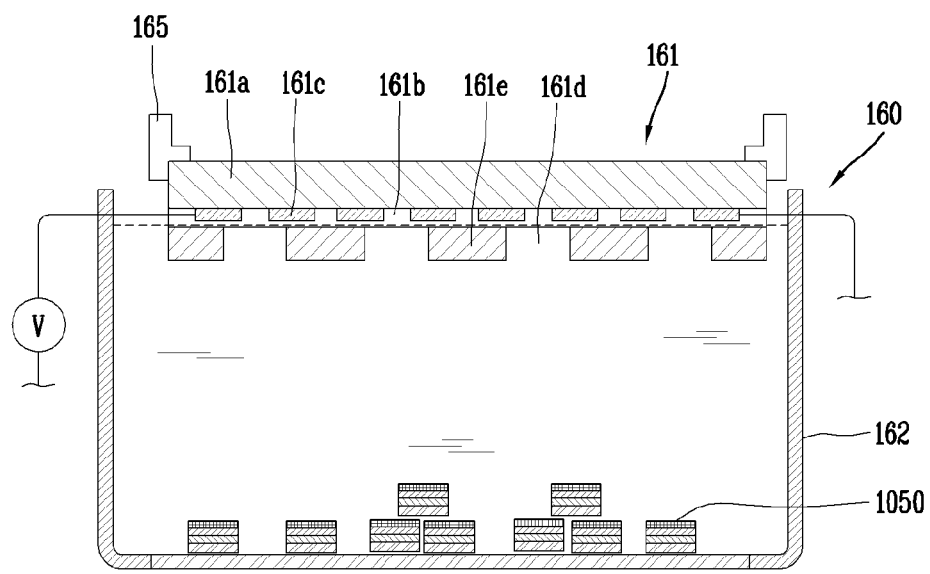
【FIG. 8b】
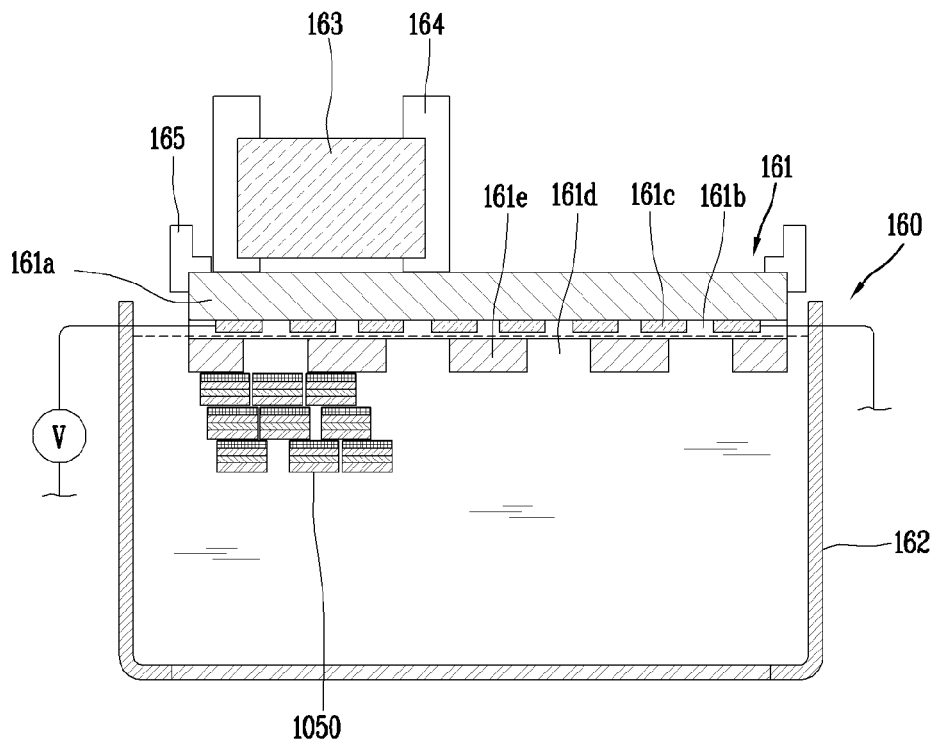

【FIG. 8c】
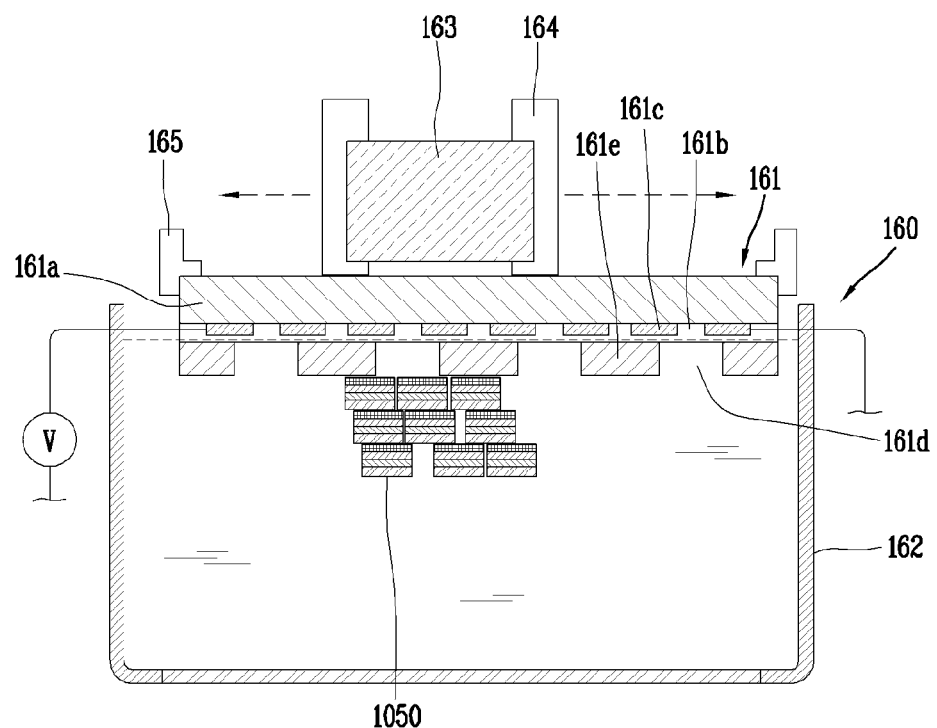

【FIG. 8d】
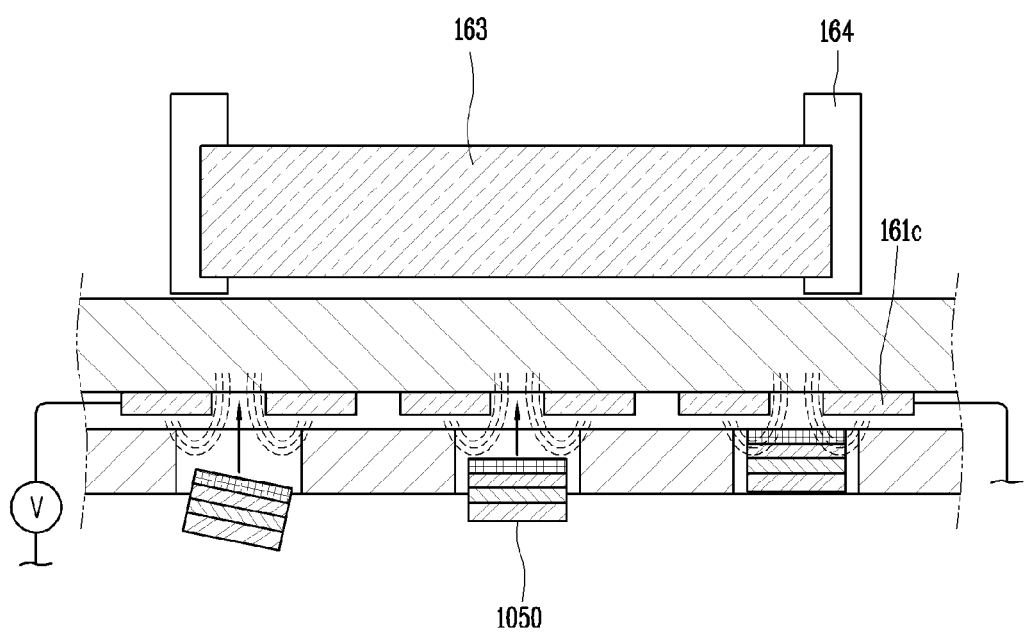

[FIG. 8e]
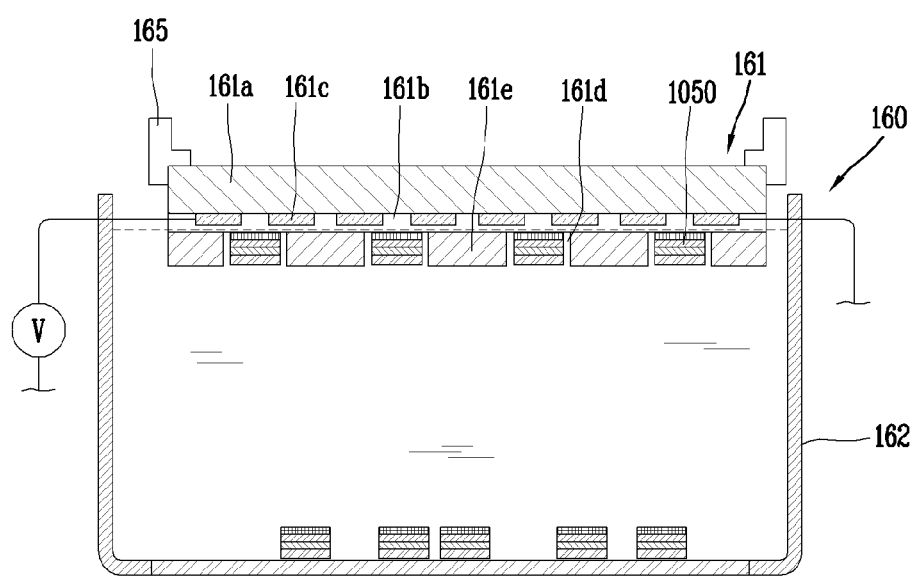

[FIG. 9]
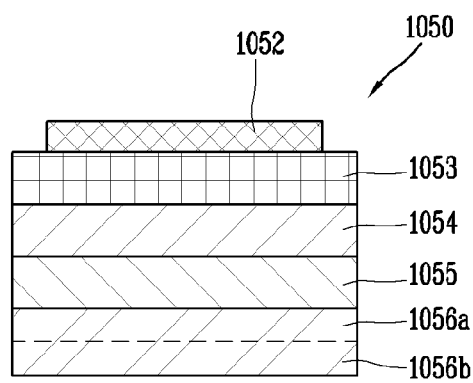

【FIG. 10】
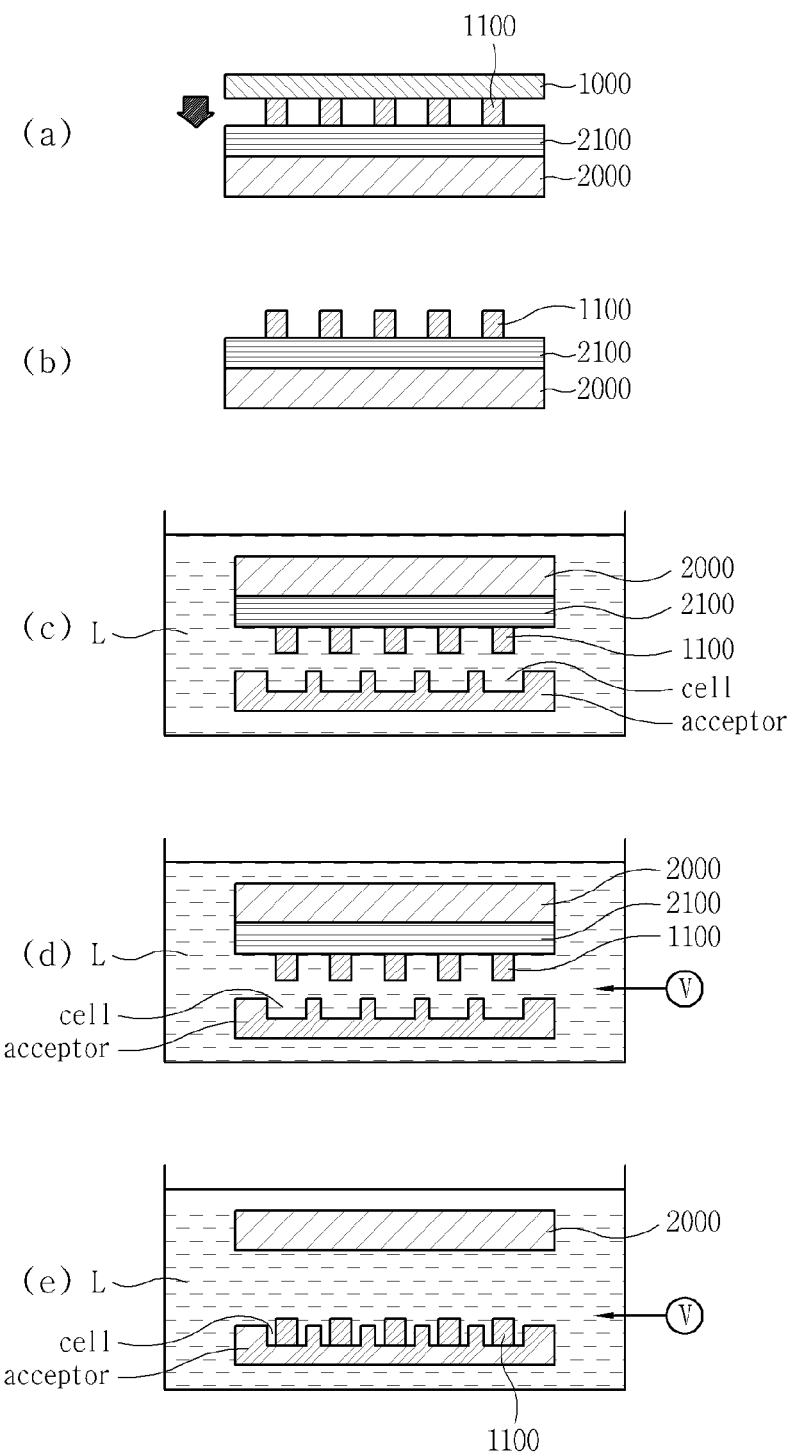

【FIG. 11】
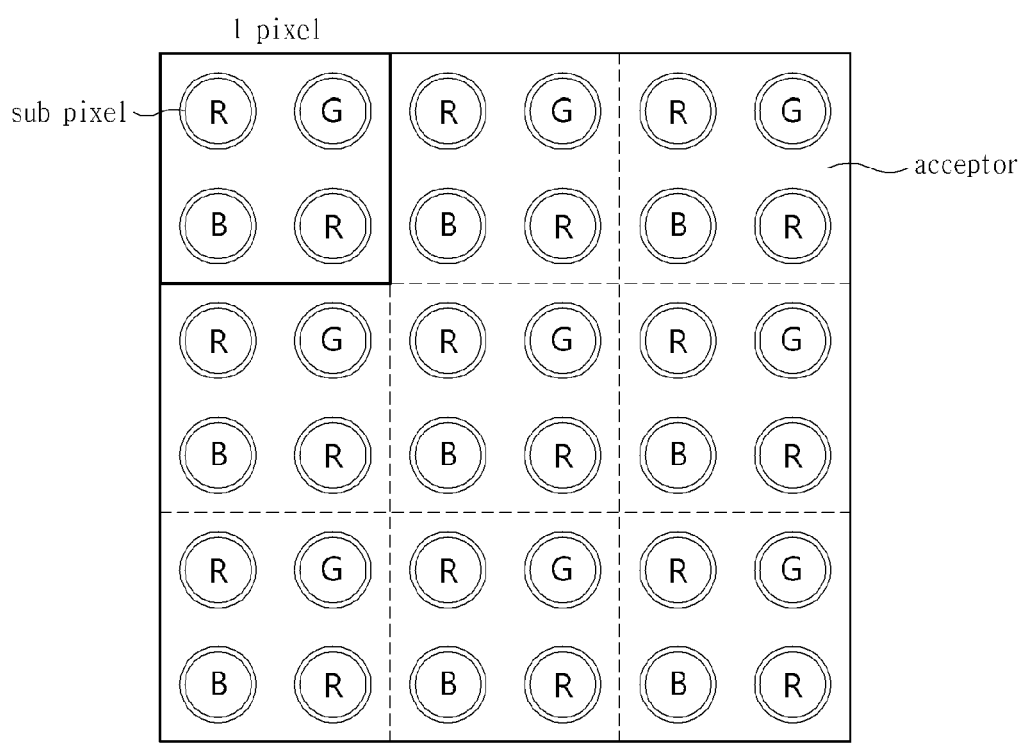

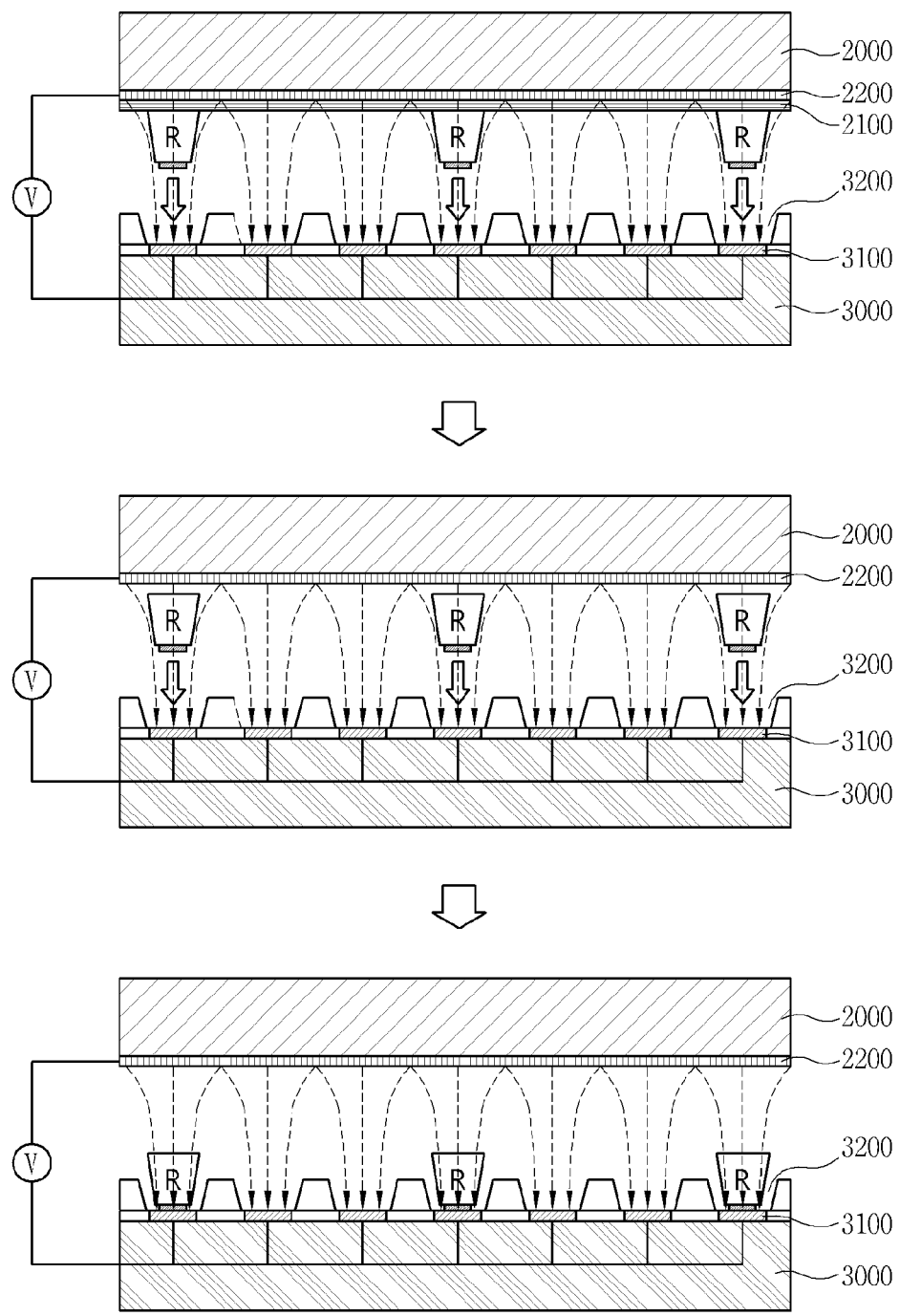
[FIG. 12a]

【FIG. 12b】
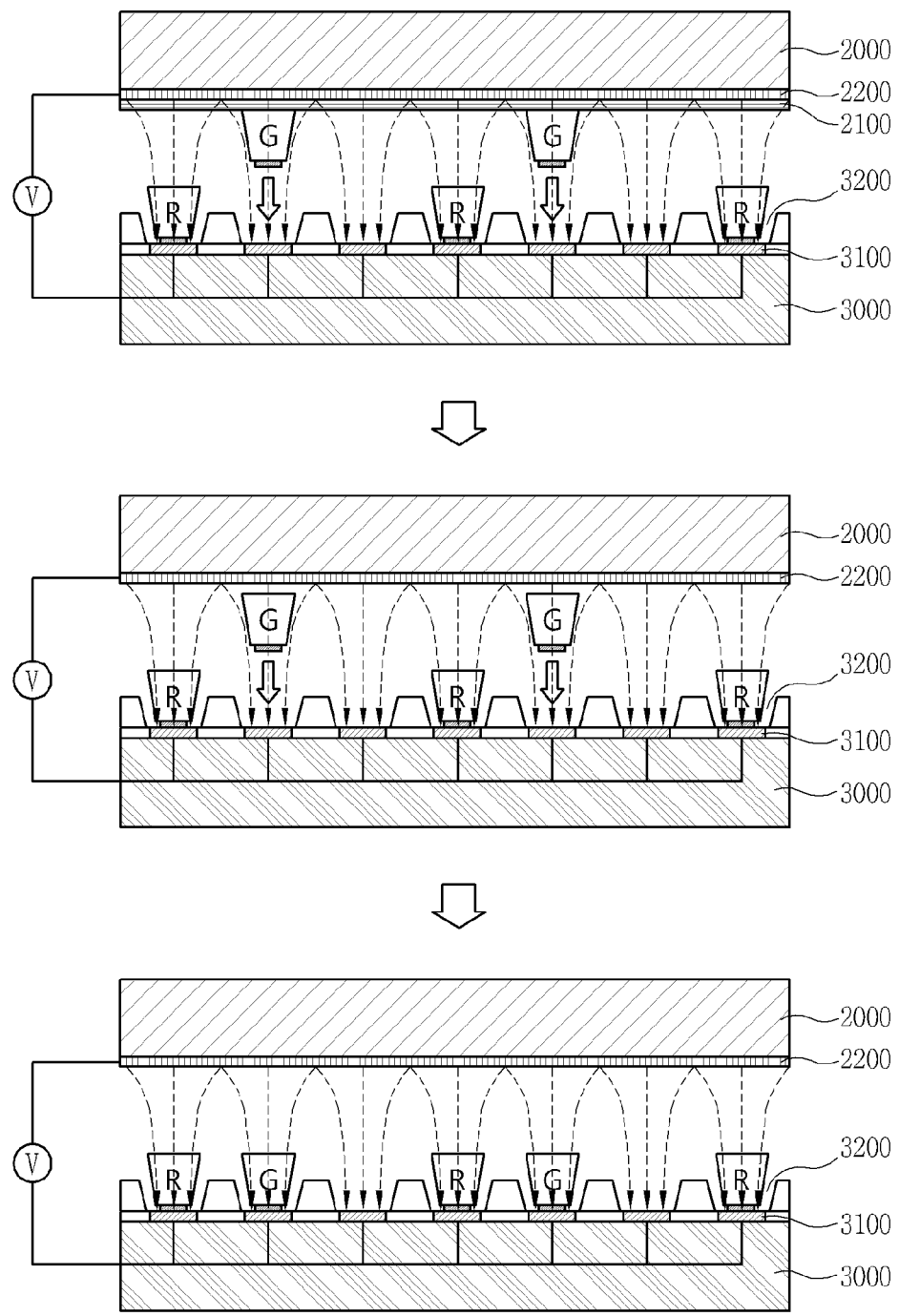

【FIG. 12c】
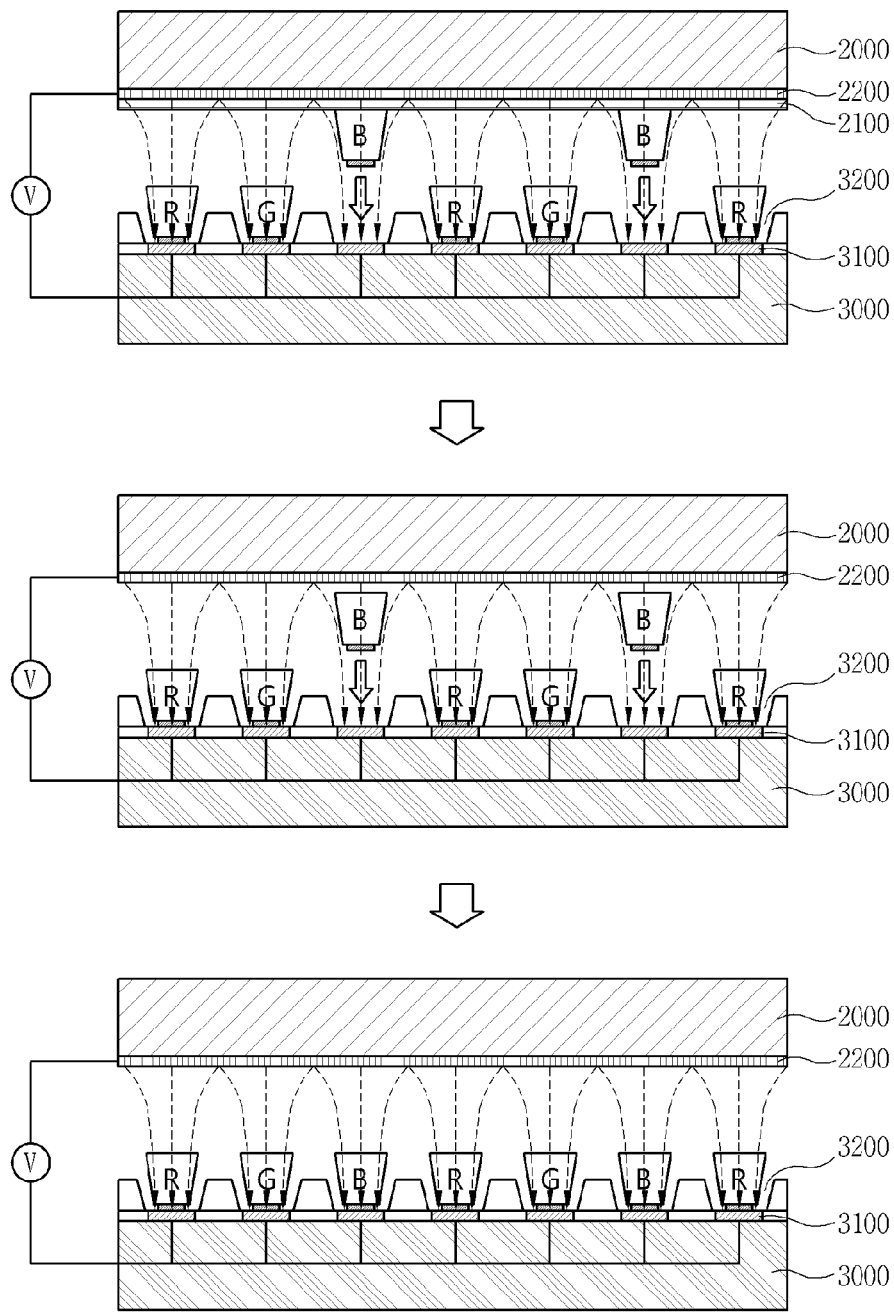

[FIG. 13a]
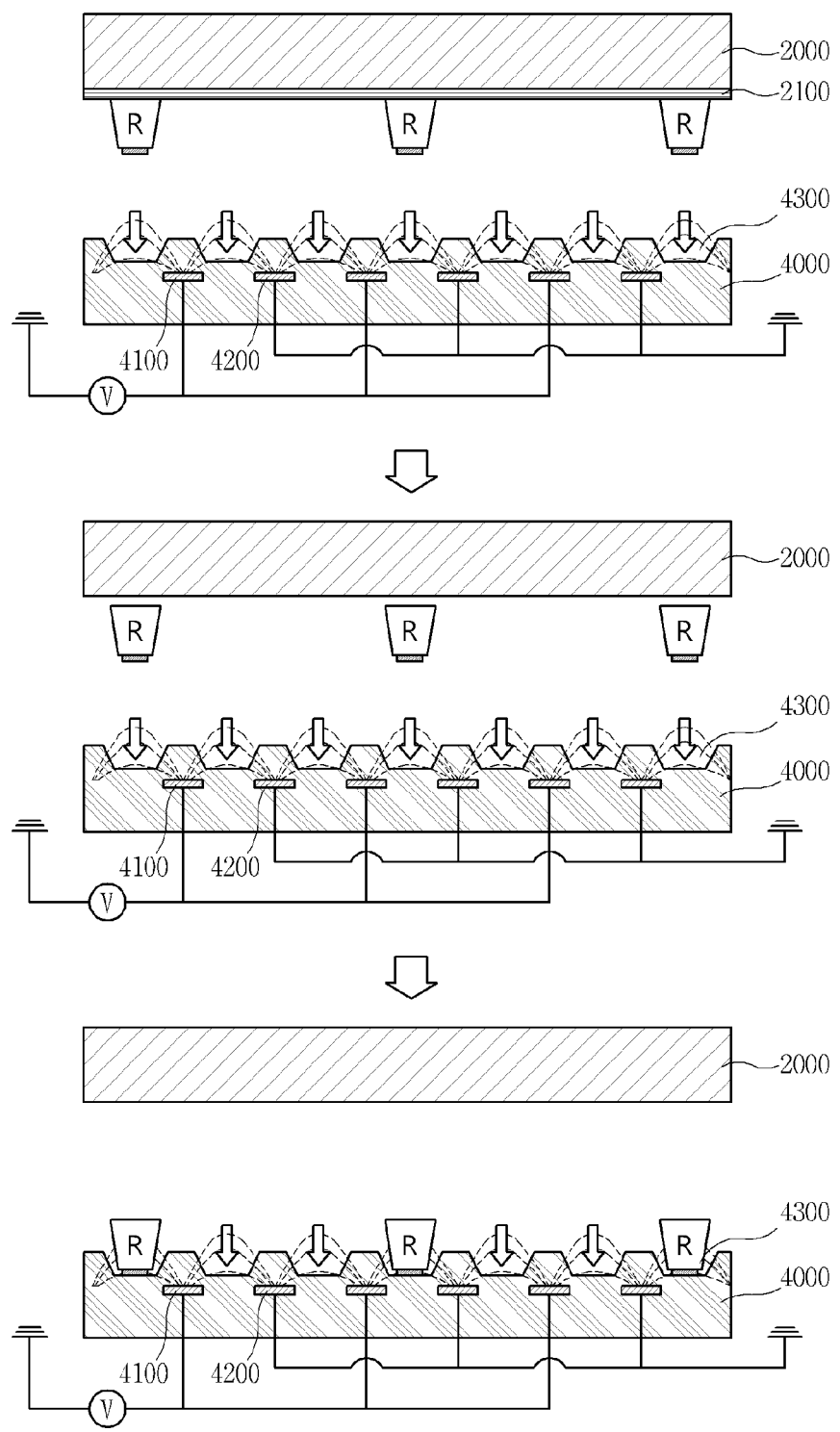

【FIG. 13b】
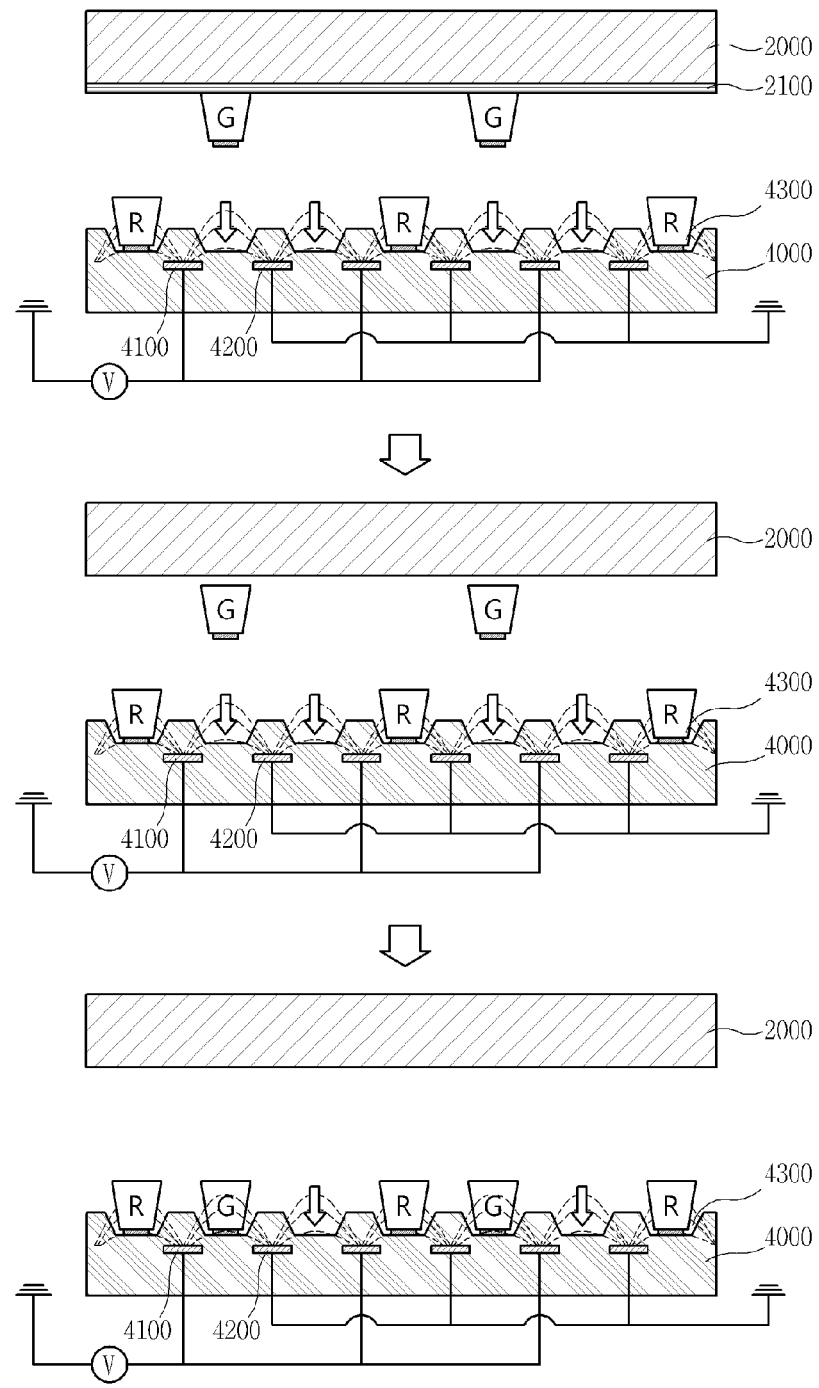

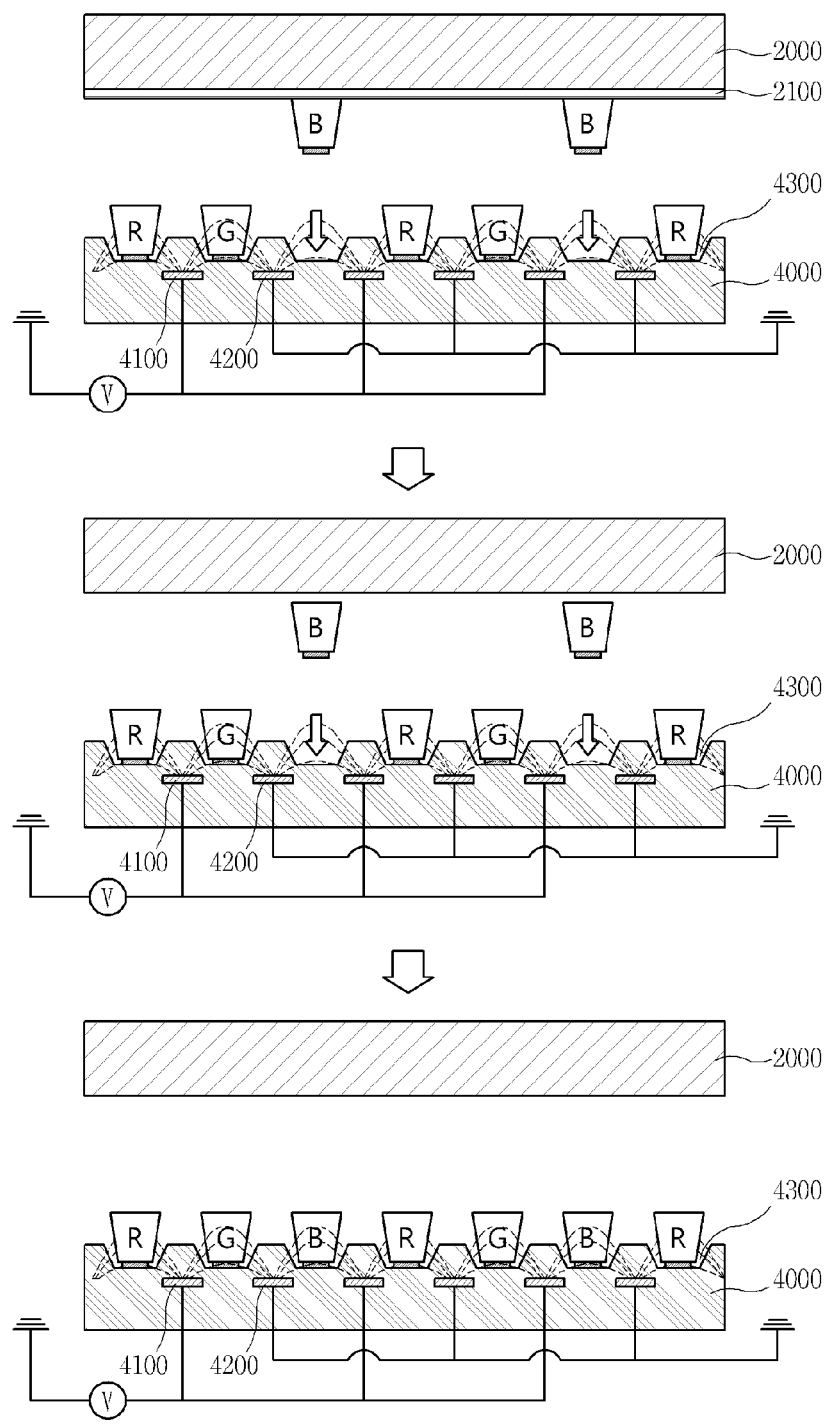
[FIG. 13c]

【FIG. 14a】
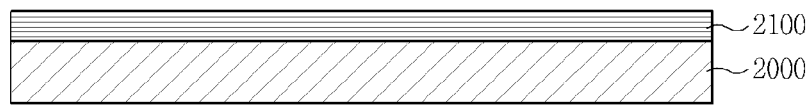
【FIG. 14b】
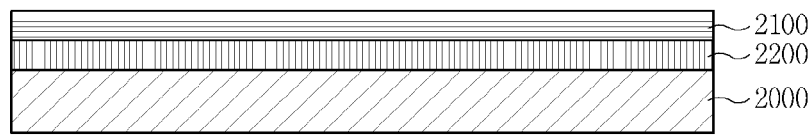
【FIG. 14c】
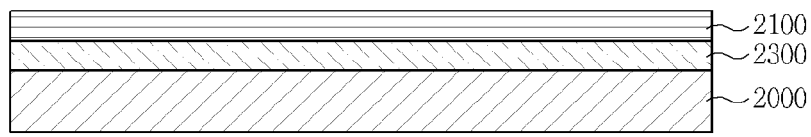
【FIG. 14d】
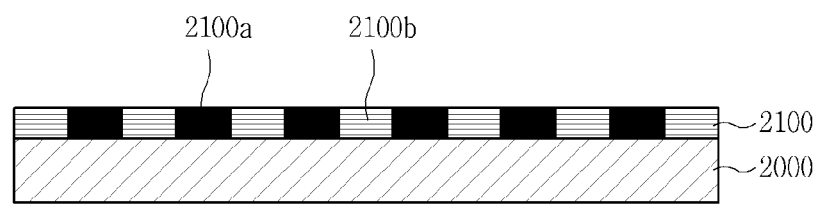

[FIG. 15]
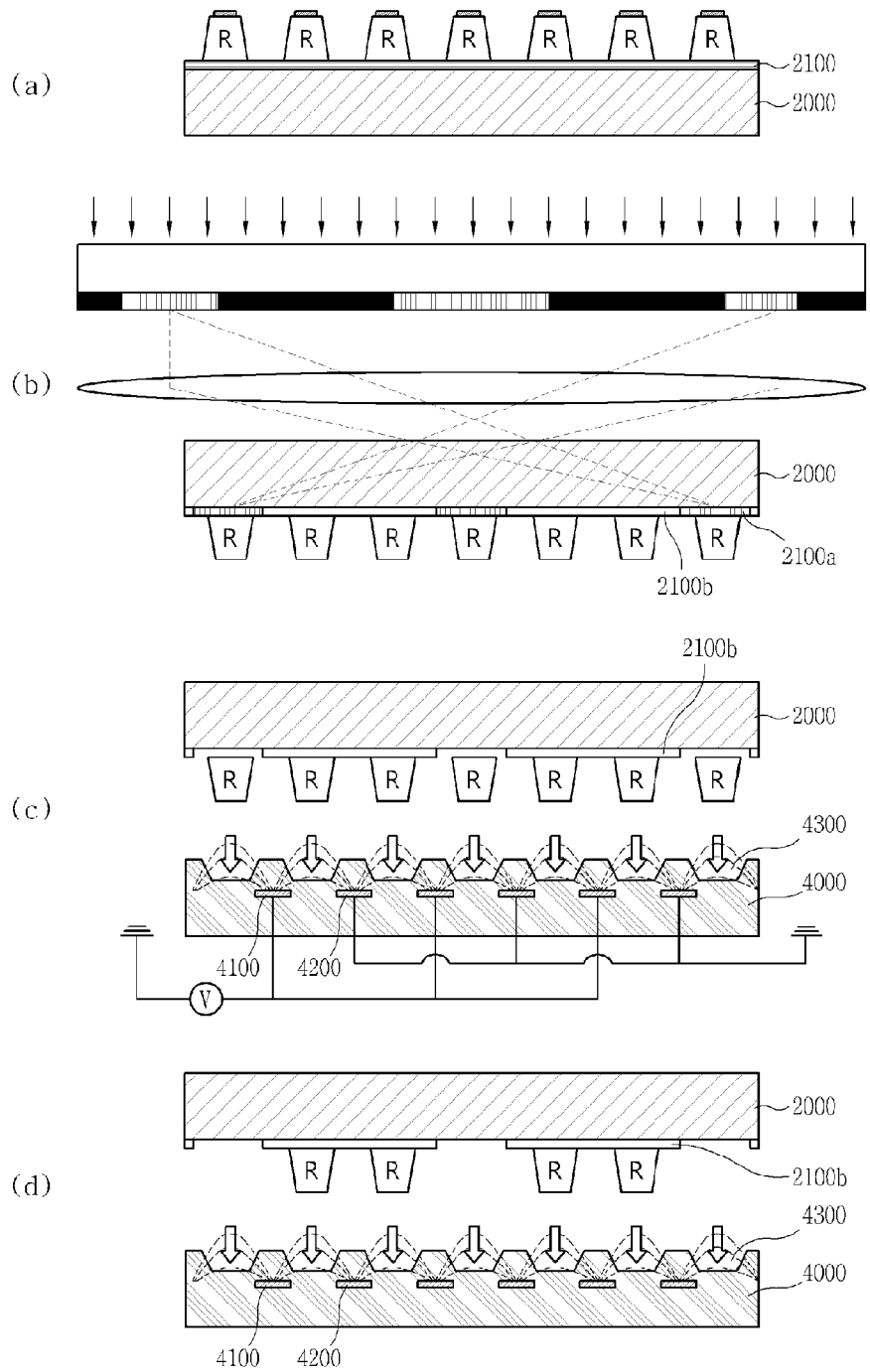

【FIG. 16】
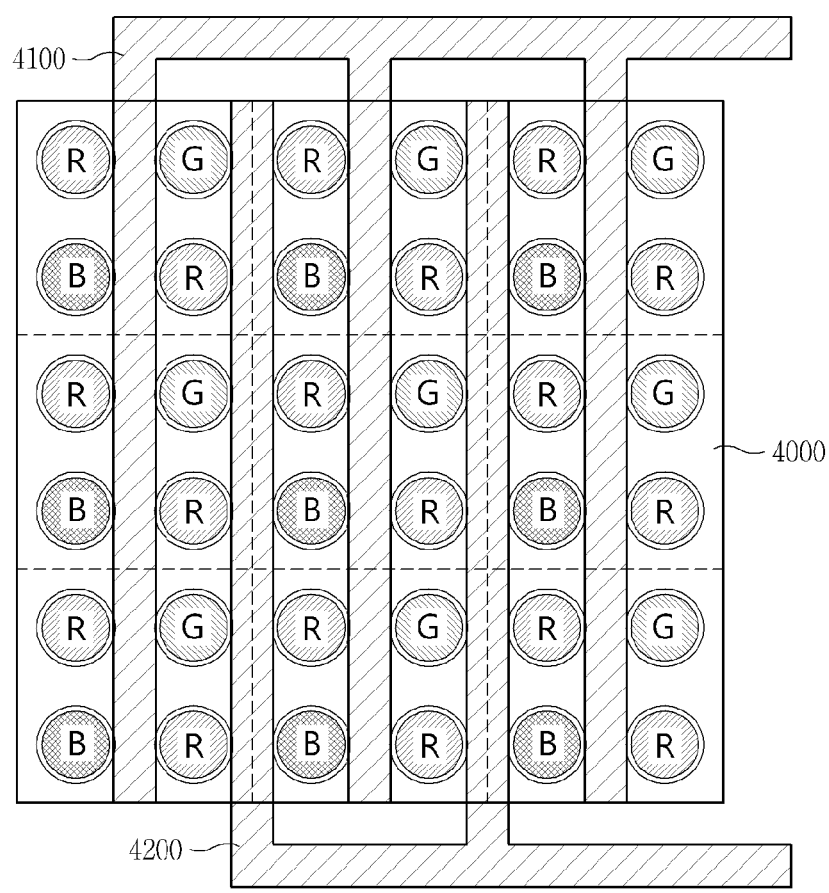

【FIG. 17a】
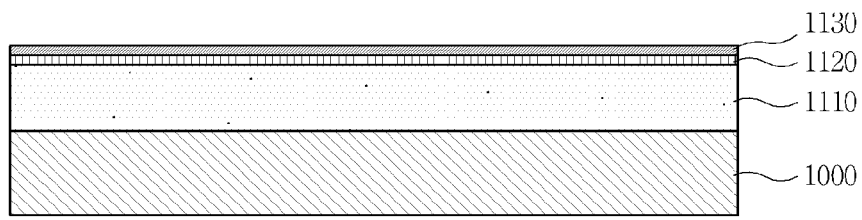
【FIG. 17b】
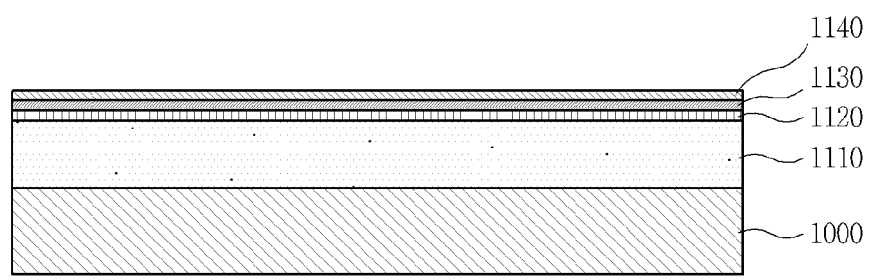
【FIG. 17c】
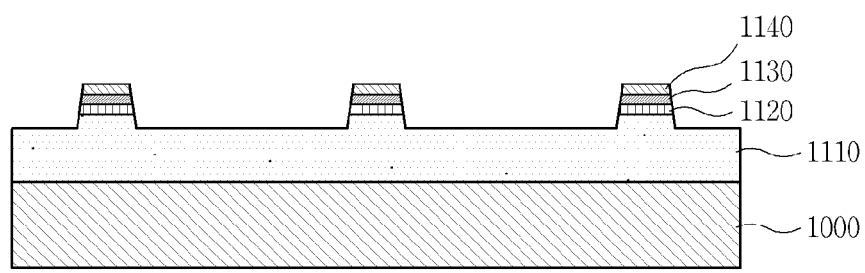

[FIG. 17d]
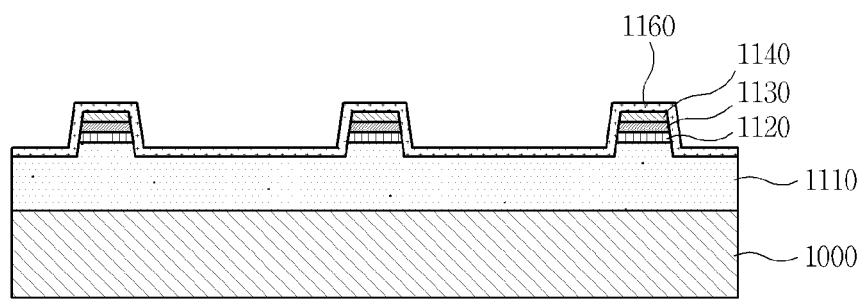

【FIG. 17e】
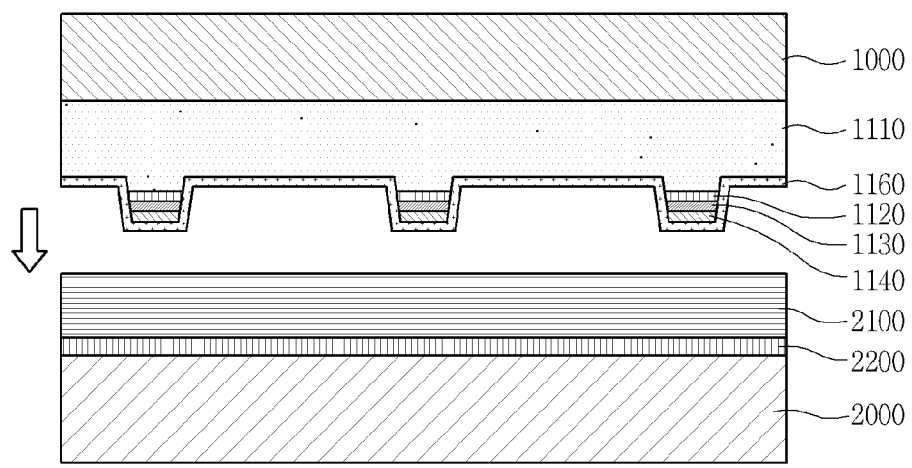
【FIG. 17f】
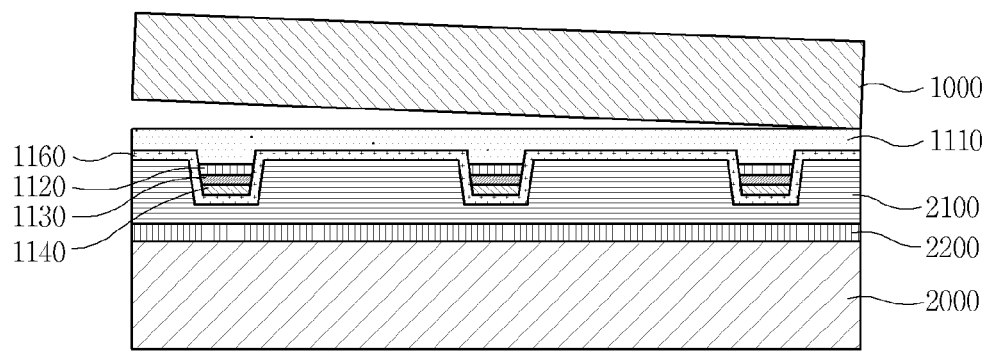

【FIG. 17g】
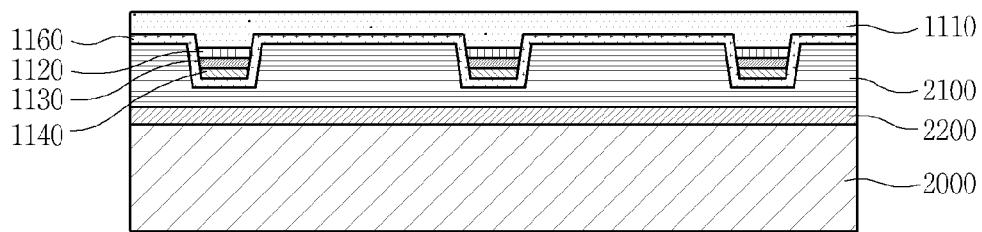
【FIG. 17h】
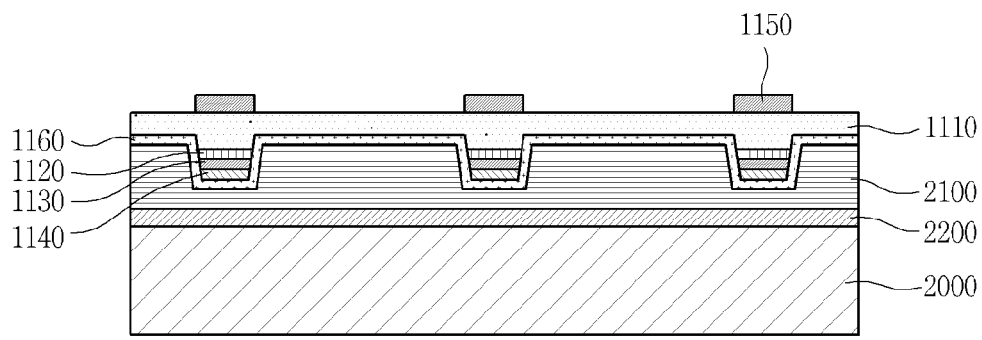
【FIG. 17i】
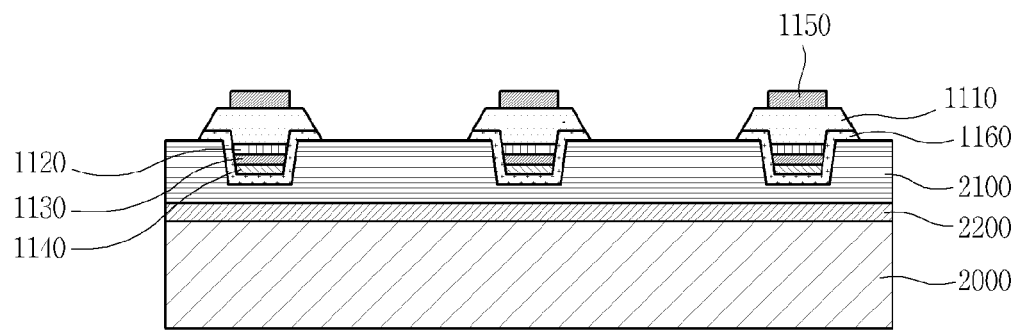

【FIG. 18a】
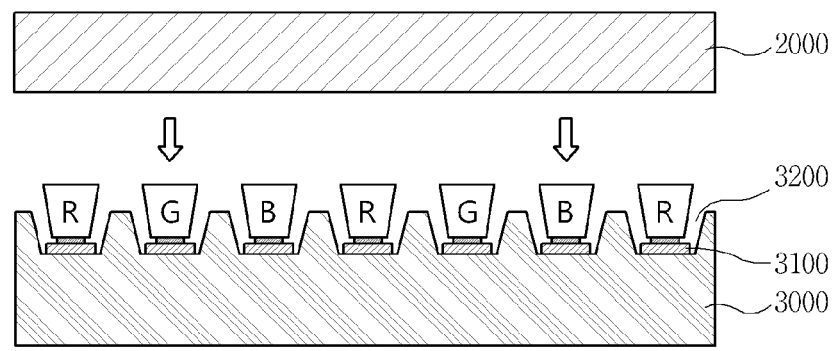
【FIG. 18b】
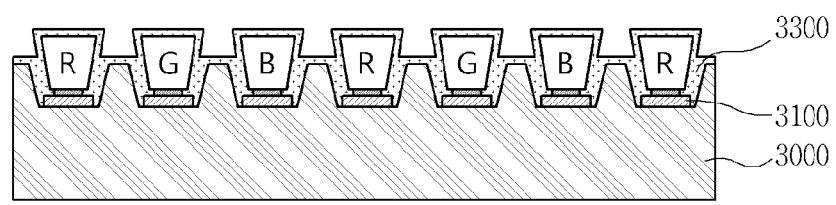
【FIG. 18c】
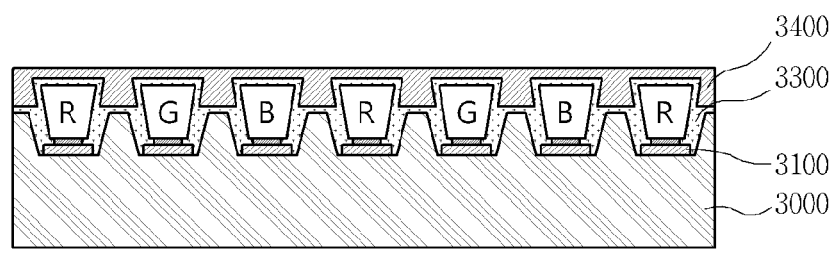

【FIG. 18d】
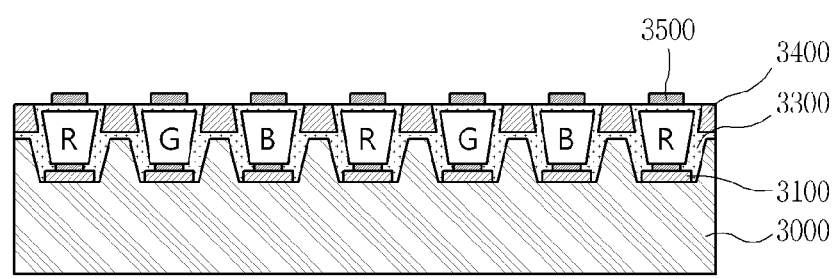

[FIG. 19a]
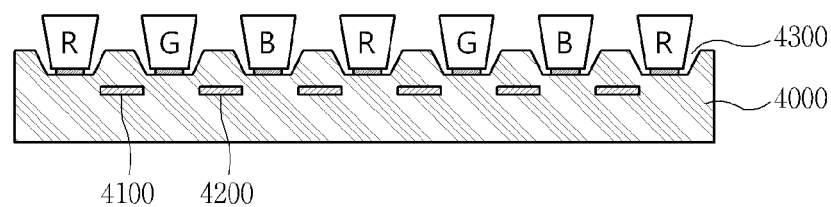
[FIG. 19b]
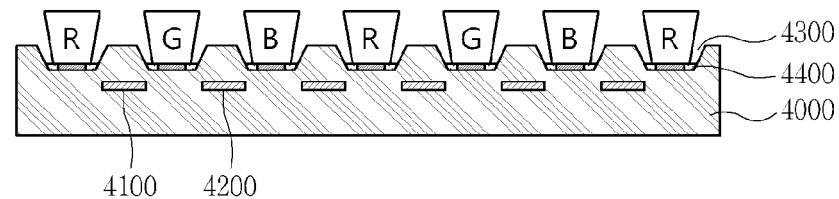
[FIG. 19c]
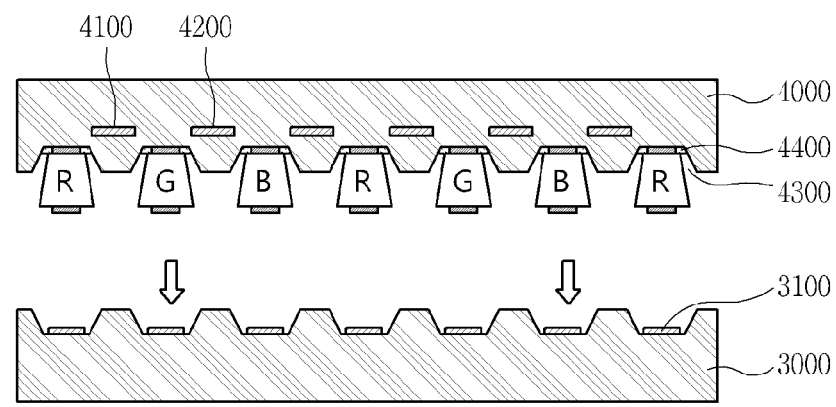

【FIG. 19d】
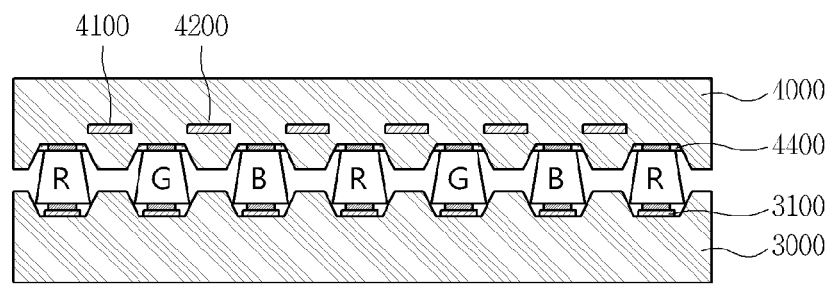
【FIG. 19e】
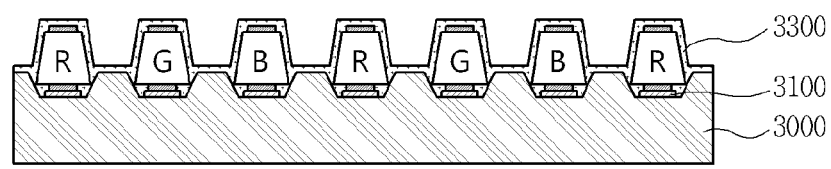
【FIG. 19f】
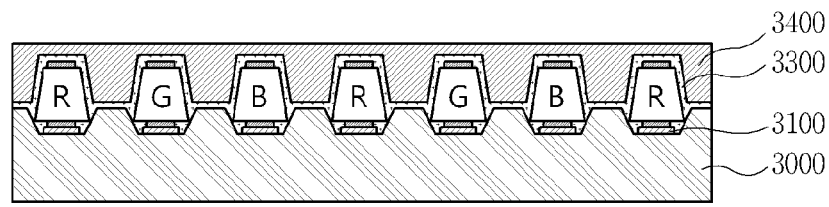
【FIG. 19g】
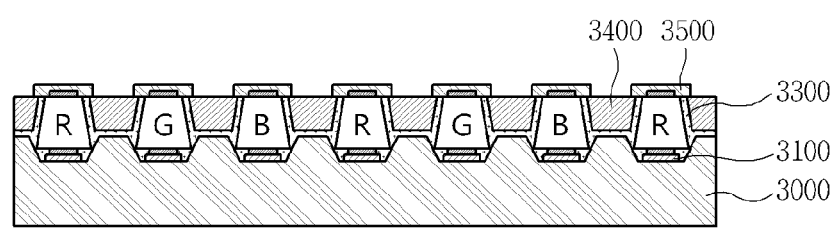

METHOD FOR MANUFACTURING DISPLAY DEVICE USING SEMICONDUCTOR LIGHT EMITTING DEVICE

CROSS-REFERENCE TO RELATED APPLICATIONS

This application is the National Stage filing under 35 U.S.C. 371 of International Application No. PCT/KR2019/009308, filed on Jul. 26, 2019, the contents of which are all incorporated by reference herein in its entirety.

TECHNICAL FIELD

The present disclosure relates to a method for manufacturing a display device using semiconductor light emitting diodes having a size of several to several tens of µm.

BACKGROUND ART

Recently, liquid crystal displays (LCD), organic light emitting diode (OLED) displays, and micro LED displays are competing to implement large-area displays in the display technology field.

However, in the case of LCD, there are problems such as slow response time and low efficiency of light generated by backlights, in the case of OLED, there are problems such as short lifespans, poor mass production yields, and low efficiency.

On the other hand, when a semiconductor light emitting diode (micro LED) having a diameter or cross-sectional area of 100 µm or less is used for a display, very high efficiency can be achieved because the display does not absorb light using a polarizing plate or the like. However, since a large display requires millions of semiconductor light emitting diodes, it is difficult to transfer the diodes compared to other technologies.

The technologies currently being developed for a transfer process may include pick & place technology, Laser Lift-off (LLO) technology, self-assembly technology or the like. Among them, the self-assembly technology is a method in which a semiconductor light emitting diode finds its own position in a fluid, and is the most advantageous method for realizing a large-screen display device.

On the other hand, as the self-assembly method, there are a method of directly assembling a semiconductor light emitting diode to a final board (or wiring board) on which wiring is formed, and a method of assembling a semiconductor light emitting diode on an assembly board and transferring the semiconductor light emitting diode to the final board through an additional transfer process. The method of directly assembling a semiconductor light emitting diode to a final board is efficient in terms of process, and the method of using the assembly board is advantageous in that structures for self-assembly can be added without limitation, so the two methods are selectively used.

DISCLOSURE

Technical Problem

An object of the present disclosure is to provide a method for manufacturing a display device capable of transferring semiconductor light emitting diodes formed at predetermined intervals on a growth substrate to a wiring board or an assembly board by self-assembly, while maintaining the intervals when the semiconductor light emitting diodes are transferred from the growth substrate to the wiring board or the assembly board.

Technical Solution

According to an embodiment of the present disclosure, a method for manufacturing a display device includes transferring semiconductor light emitting diodes formed on a growth substrate to a temporary board by bonding the growth substrate on which the semiconductor light emitting diodes are formed at predetermined intervals and the temporary board on which a sacrificial layer to be etched in a fluid is formed; putting an acceptor board in which cells on which the semiconductor light emitting diodes are to be seated are formed at predetermined intervals into the fluid; aligning the temporary board in the fluid such that the sacrificial layer faces the acceptor board; forming an electric field for moving the semiconductor light emitting diodes by applying power to at least one of the temporary board and the acceptor board; and placing the semiconductor light emitting diodes separated from the temporary board on the cells formed in the acceptor board, wherein the semiconductor light emitting diodes are seated on the acceptor board while maintaining same intervals as the intervals formed on the growth substrate.

In the present embodiment, at least the semiconductor light emitting diodes fixed to the temporary board may be aligned to face the cells formed in the acceptor board.

In the present embodiment, the acceptor board may include at least one of a first assembly electrode and a second assembly electrode that form an electric field when power is applied, and the acceptor board may be an assembly board which temporarily accommodates the semiconductor light emitting diodes, or a wiring board on which a driving electrode for driving the semiconductor light emitting diodes is formed.

In the present embodiment, the temporary board may include a third assembly electrode that forms an electric field for moving the semiconductor light emitting diodes in cooperation with the first assembly electrode or the second assembly electrode of the acceptor board when power is applied, and the third assembly electrode may be formed of a transparent conductive material.

In the present embodiment, the first assembly electrode and the second assembly electrode may be formed to be parallel to each other.

In the present embodiment, the driving electrode may include a metal solder electrically connected to the semiconductor light emitting diodes, and the wiring board may include at least a portion of the metal solder exposed to a bottom surface of the cells.

In the present embodiment, wherein the temporary board may include an auxiliary bonding layer formed of a photosensitive material under the sacrificial layer.

In the present embodiment, the sacrificial layer may include an exposed region that is formed of a photosensitive material and is etched in the fluid and a non-exposed region that is not etched in the fluid, and at least some semiconductor light emitting diodes may be fixed to the exposed region.

In the present embodiment, the method may further include discharging the fluid to a side where the acceptor board is disposed after the transferring of the semiconductor light emitting diodes fixed to the temporary board is completed.

In the present embodiment, the method may further include selectively applying an adhesive material to the assembly board after the transferring of the semiconductor light emitting diodes fixed to the temporary board is completed when the acceptor board is the assembly board.

In the present embodiment, the semiconductor light emitting diodes may include a blue semiconductor light emitting diode that emits blue light, a green semiconductor light emitting diode that emits green light and a red semiconductor light emitting diode that emits red light.

Advantageous Effects

In the method of manufacturing a display device according to an embodiment of the present disclosure, the semiconductor light emitting diodes formed on the temporary board are transferred to the acceptor board while maintaining intervals, thus making it possible to seat a specific semiconductor light emitting diode in a cell at a specific position through alignment of the temporary board and the acceptor board.

In addition, since the self-assembly of the semiconductor light emitting diodes formed on the temporary board proceeds at the same time, the efficiency of the process can be improved, and the movement distance of the semiconductor light emitting diodes is minimized to prepare for the loss or damage of the semiconductor light emitting semiconductor diodes.

DESCRIPTION OF DRAWINGS

FIG. 1 is a conceptual diagram illustrating an embodiment of a display device using a semiconductor light emitting diode of the present disclosure.

FIG. 2 is a partially enlarged view of portion A of the display device of FIG. 1.

FIG. 3 is an enlarged view of the semiconductor light emitting diode of FIG. 2.

FIG. 4 is an enlarged view illustrating another embodiment of the semiconductor light emitting diode of FIG. 2.

FIGS. 5a to 5e are conceptual views for describing a new process of manufacturing the semiconductor light emitting diode.

FIG. 6 is a conceptual diagram illustrating an example of a self-assembly apparatus of a semiconductor light emitting diode according to the present disclosure.

FIG. 7 is a block diagram of the self-assembly apparatus of FIG. 6.

FIGS. 8a to 8e are conceptual views illustrating a process of self-assembling a semiconductor light emitting diode using the self-assembly apparatus of FIG. 6.

FIG. 9 is a conceptual diagram for describing the semiconductor light emitting diode of FIGS. 8a to 8e.

FIG. 10 is a view schematically showing a self-assembly process according to the present disclosure.

FIG. 11 is a view showing sub-pixels on an acceptor board and arrangement of the pixels according to an embodiment of the present disclosure.

FIGS. 12a to 12c are views showing a self-assembly process according to an embodiment (wiring board) of the present disclosure, FIGS. 13a to 13c are a self-assembly process according to another embodiment (assembly board) of the present disclosure, and FIGS. 14a to 14d are diagrams showing a structure of a temporary board according to embodiments of the present disclosure, and FIG. 15 is a diagram showing a self-assembly process using the temporary board according to FIG. 14d.

FIG. 16 is a view showing the assembly electrode formed on the assembly board according to an embodiment of the present disclosure.

FIGS. 17a to 17i are diagrams showing operations including operation for manufacturing semiconductor light emitting diodes to operation for transferring the semiconductor light emitting diodes to a temporary board as a pre-process of the self-assembly process according to an embodiment of the present disclosure.

FIGS. 18a to 18d are diagrams showing a post-process of the self-assembly process according to an embodiment of the present disclosure.

FIGS. 19a to 19g are diagrams showing a post-process of a self-assembly process according to another embodiment of the present disclosure.

MODE FOR INVENTION

Hereinafter, the embodiments disclosed herein will be described in detail with reference to the accompanying drawings, and the same or similar elements are designated with the same numeral references regardless of the numerals in the drawings and their redundant description will be omitted. The suffixes "module" and "unit or portion" for components used in the following description are merely provided only for facilitation of preparing this specification, and thus they are not granted a specific meaning or function. In addition, when it is determined that the detailed description of the related known technology may obscure the gist of embodiments disclosed herein in describing the embodiments, a detailed description thereof will be omitted. Further, it should be noted that the accompanying drawings are only for easy understanding of the embodiments disclosed in the present specification, and should not be construed as limiting the technical spirit disclosed in the present specification by the accompanying drawings. It is also understood that when an element, such as a layer, region, or substrate, it is referred to as being "on" another element, it may be directly present on the other element or intervening elements in between.

The display device described in this specification may include a mobile phone, a smart phone, a laptop computer, a digital broadcasting terminal, a personal digital assistant (PDA), a portable multimedia player (PMP), a navigation system, and a slate PC, a tablet PC, an ultra book, a digital TV, a desktop computer and the like.

FIG. 1 is a conceptual diagram illustrating an embodiment of a display device using a semiconductor light emitting diode of the present disclosure, FIG. 2 is a partially enlarged view of portion A of the display device of FIG. 1, FIG. 3 is an enlarged view of the semiconductor light emitting diode of FIG. 2, and FIG. 4 is an enlarged view illustrating another embodiment of the semiconductor light emitting diode of FIG. 2.

As illustrated, information processed by a controller of a display device 100 may be output from a display module 140. A closed-loop-type case 101 surrounding edges of the display module may form a bezel of the display device.

The display module 140 may include a panel 141 on which images are displayed, and the panel 141 may include a micro-sized semiconductor light emitting diode 150 and a wiring board 110 on which the semiconductor light emitting diode 150 is mounted.

Wirings may be formed on the wiring board 110 to be connected to an n-type electrode 152 and a p-type electrode 156 of the semiconductor light emitting diode 150. Through this, the semiconductor light emitting diode 150 may be provided on the wiring board 110 as an individual pixel that emits light itself.

An image displayed on the panel 141 is visual information, and is implemented by independently controlling light emission of sub-pixels arranged in a matrix form through the wirings.

In the present disclosure, a micro LED (Light Emitting Diode) is exemplified as a type of the semiconductor light emitting diode 150 that converts current into light. The micro LED may be a light emitting diode formed in a small size of 100 micro or less. In the semiconductor light emitting diode 150, blue, red, and green colors are provided in light emitting regions, respectively, and a unit pixel may be realized by a combination thereof. That is, the unit pixel may mean a minimum unit for realizing one color, and at least three micro LEDs may be provided in the unit pixel.

More specifically, referring to FIG. 3, the semiconductor light emitting diode 150 may have a vertical structure.

For example, the semiconductor light emitting diode 150 is mainly made of gallium nitride (GaN), and indium (In) and/or aluminum (Al) are added together to implement a high output light emitting diode that emits various lights including blue.

The vertical semiconductor light emitting diode may include a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 positioned in a lower portion may be electrically connected to the p-electrode of the wiring board, and the n-type electrode 152 positioned in a upper portion may be electrically connected to the n-electrode at the upper side of the semiconductor light emitting diode. The vertical semiconductor light emitting diode 150 has a great advantage in that it is possible to reduce the chip size because electrodes are arranged up and down.

As another example, referring to FIG. 4, the semiconductor light emitting diode may be a flip chip type light emitting diode.

For this example, the semiconductor light emitting diode 250 may include a p-type electrode 256, a p-type semiconductor layer 255 on which the p-type electrode 256 is formed, an active layer 254 formed on the p-type semiconductor layer 255, an n-type semiconductor layer 253 formed on the active layer 254, and an n-type electrode 252 spaced apart from the p-type electrode 256 in the horizontal direction on the n-type semiconductor layer 253. In this case, both the p-type electrode 256 and the n-type electrode 152 may be electrically connected to the p-electrode and n-electrode of the wiring board under the semiconductor light emitting diode.

The vertical semiconductor light emitting diode and the horizontal semiconductor light emitting diode may be a green semiconductor light emitting diode, a blue semiconductor light emitting diode, or a red semiconductor light emitting diode, respectively. In the case of the green semiconductor light emitting diode and the blue semiconductor light emitting diode, gallium nitride (GaN) is mainly used, and indium (In) and/or aluminum (Al) are added together to implement a high output light emitting diode that emits green or blue light. For this example, the semiconductor light emitting diode may be a gallium nitride thin film formed in various layers such as n-Gan, p-Gan, AlGaN, InGan, etc. Specifically, the p-type semiconductor layer may be P-type GaN, and the n-type semiconductor layer may be N-type GaN. However, in the case of the red semiconductor light emitting diode, the p-type semiconductor layer may be P-type GaAs, and the n-type semiconductor layer may be N-type GaAs.

In addition, the p-type semiconductor layer may be P-type GaN doped with Mg on the p-electrode side, and the n-type semiconductor layer may be N-type GaN doped with Si on the n-electrode side. In this case, the above-described semiconductor light emitting diodes may be semiconductor light emitting diodes having no active layer.

Meanwhile, referring to FIGS. 1 to 4, since the light emitting diodes are very small, unit pixels that emit light themselves may be arranged in a high definition in the display panel, thereby realizing a high-definition display device.

In the display device using the semiconductor light emitting diode of the present disclosure described above, the semiconductor light emitting diode grown on a wafer and formed through mesa and isolation is used as an individual pixel. In this case, the micro-sized semiconductor light emitting diode 150 needs to be transferred to the wafer at a predetermined position on the board of the display panel. There is a pick and place technique as such a transfer technique, but the success rate is low and a lot of time is required. As another example, there is a technique of transferring several devices at a time using a stamp or a roll, but it is not suitable for a large screen display due to a limitation in yield. The present disclosure proposes a new manufacturing method and manufacturing apparatus for a display device that can solve these problems.

To this end, a new method of manufacturing a display device will be described below. FIGS. 5a to 5e are conceptual views for describing a new process of manufacturing the semiconductor light emitting diode.

In the present specification, a display device using a passive matrix (PM) type semiconductor light emitting diode is taken as an example. However, the examples described below are also applicable to an active matrix (AM) type semiconductor light emitting diode. In addition, although a method of self-assembling a horizontal semiconductor light emitting diode is described as an example, it is also applicable to a method of self-assembling a vertical semiconductor light emitting diode.

First, according to the manufacturing method, a first conductivity type semiconductor layer 153, an active layer 154, and a second conductivity type semiconductor layer 155 are individually grown on a growth substrate 159 (FIG. 5a).

After the first conductivity type semiconductor layer 153 is grown, the active layer 154 is grown on the first conductivity type semiconductor layer 153, and then the second conductivity type semiconductor layer 155 is grown on the active layer 154. In this way, when the first conductivity type semiconductor layer 153, the active layer 154, and the second conductivity type semiconductor layer 155 are sequentially grown, as shown in FIG. 5a, the first conductivity type semiconductor layer 153, the active layer 154 and the second conductive semiconductor layer 155 form a stacked structure.

In this case, the first conductivity type semiconductor layer 153 may be a p-type semiconductor layer, and the second conductivity type semiconductor layer 155 may be an n-type semiconductor layer. However, the present disclosure is not necessarily limited thereto, and the first conductivity type may be n-type and the second conductivity type may be p-type.

In addition, although the present embodiment exemplifies the case in which the active layer is present, a structure in which the active layer is not present is also possible in some cases as described above. As an example, the p-type semiconductor layer may be P-type GaN doped with Mg, and the n-type semiconductor layer may be N-type GaN doped with Si on the n-electrode side.

The growth substrate 159 (wafer) may be formed of a material having a light-transmitting property, for example, any one of sapphire (Al2O3), GaN, ZnO, and AlO, but is not limited thereto. In addition, the growth substrate 1059 may be formed of a material suitable for semiconductor material growth, a carrier wafer. The growth substrate 159 may be formed of a material having excellent thermal conductivity, and may include a conductive board or an insulating board, for example, a SiC board having higher thermal conductivity than a sapphire (Al2O3) board, or use at least one of Si, GaAs, GaP, InP, and Ga2O3.

Next, at least a portion of the first conductivity type semiconductor layer 153, the active layer 154, and the second conductivity type semiconductor layer 155 are removed to form a plurality of semiconductor light emitting diodes (FIG. 5b).

More specifically, isolation is performed such that the plurality of light emitting diodes form a light emitting diode array. That is, the first conductivity type semiconductor layer 153, the active layer 154, and the second conductivity type semiconductor layer 155 are vertically etched to form a plurality of semiconductor light emitting diodes.

In the case of forming a horizontal type semiconductor light emitting diode, a mesa process in which the active layer 154 and the second conductivity type semiconductor layer 155 are partially removed in the vertical direction and the first conductivity type semiconductor layer 153 is exposed to the outside and thereafter, isolation in which the first conductivity type semiconductor layer is etched to form a plurality of semiconductor light emitting diode arrays may be performed.

Next, second conductivity type electrodes 156 (or p-type electrodes) are formed on one surface of the second conductivity type semiconductor layer 155 (FIG. 5c). The second conductive electrode 156 may be formed by a deposition method such as sputtering, but the present disclosure is not limited thereto. However, when the first conductive semiconductor layer and the second conductive semiconductor layer are an n-type semiconductor layer and a p-type semiconductor layer, respectively, the second conductivity type electrode 156 may be an n-type electrode.

Then, the growth substrate 159 is removed to provide a plurality of semiconductor light emitting diodes. For example, the growth substrate 1059 may be removed using a laser lift-off (LLO) method or a chemical lift-off (CLO) method (FIG. 5d).

Thereafter, the semiconductor light emitting diodes 150 are seated on a board in a chamber filled with a fluid (FIG. 5e).

For example, the semiconductor light emitting diodes 150 and the board are put in the chamber filled with a fluid, and the semiconductor light emitting diodes are self-assembled onto the board 1061 using flow, gravity, surface tension, and the like. In this case, the board may be an assembly board 161.

As another example, it is also possible to put the wiring board in a fluid chamber instead of the assembly board 161 so that the semiconductor light emitting diodes 150 are directly seated on the wiring board. In this case, the board may be the wiring board. However, for convenience of description, in the present disclosure, the board is provided as, for example, the assembly board 161 on which the semiconductor light emitting diodes 1050 are seated.

Cells (not shown) in which the semiconductor light emitting diodes 150 are inserted may be provided in the assembly board 161 to facilitate mounting of the semiconductor light emitting diodes 150 on the assembly board 161. Specifically, cells in which the semiconductor light emitting diodes 150 are seated are formed in the assembly board 161 at positions where the semiconductor light emitting diodes 150 are to be aligned with wiring electrodes. The semiconductor light emitting diodes 150 are assembled to the cells while moving in the fluid.

After a plurality of semiconductor light emitting diodes are arrayed on the assembly board 161, the semiconductor light emitting diodes of the assembly board 161 are transferred to a wiring board, enabling large-area transfer. Accordingly, the assembly board 161 may be referred to as a temporary board.

On the other hand, in order to apply the self-assembly method described above to the manufacture of a large-screen display, it is necessary to increase transfer yield. The present disclosure proposes a method and apparatus for minimizing the influence of gravity or frictional force and preventing non-specific binding in order to increase the transfer yield.

In this case, in the display device according to the present disclosure, a magnetic material is disposed on the semiconductor light emitting diode to move the semiconductor light emitting diode using magnetic force, and the semiconductor light emitting diode is seated at a predetermined position by using an electric field during movement. Hereinafter, the transfer method and apparatus will be described in more detail with the accompanying drawings.

FIG. 6 is a conceptual diagram illustrating an example of a self-assembly apparatus of a semiconductor light emitting diode according to the present disclosure, and FIG. 7 is a block diagram of the self-assembly apparatus of FIG. 6. FIGS. 8a to 8d are conceptual views illustrating a process of self-assembling a semiconductor light emitting diode using the self-assembly apparatus of FIG. 6, and FIG. 9 is a conceptual diagram for describing the semiconductor light emitting diode of FIGS. 8a to 8d.

Referring to FIGS. 6 and 7, a self-assembly apparatus 160 of the present disclosure may include a fluid chamber 162, a magnet 163 and a position control unit 164.

The fluid chamber 162 has a space for accommodating a plurality of semiconductor light emitting diodes. The space may be filled with a fluid, and the fluid may include water or the like as an assembly solution. Accordingly, the fluid chamber 162 may be a water tank and may be configured in an open type. However, the present disclosure is not limited thereto, and the fluid chamber 162 may be of a closed type in which the space is a closed space.

The board 161 may be disposed in the fluid chamber 162 such that an assembly surface on which the semiconductor light emitting diodes 150 are assembled faces downward. For example, the board 161 may be transferred to an assembly position by a transfer device, and the transfer device may include a stage 165 on which the board is mounted. The position of the stage 165 is controlled by the control unit, and through this, the board 161 may be transferred to the assembly position.

In this case, in the assembly position, the assembly surface of the board 161 faces the bottom of the fluid chamber 150. As shown, the assembly surface of the board 161 is disposed to be immersed in the fluid in the fluid chamber 162. Accordingly, the semiconductor light emitting diode 150 moves to the assembly surface in the fluid.

The board 161 is an assembly board in which an electric field is able to be formed, and may include a base portion 161a, a dielectric layer 161b, and a plurality of electrodes 161c.

The base portion 161a may be formed of an insulating material, and the plurality of electrodes 161c may be a thin or thick bi-planar electrode patterned on one surface of the base portion 161a. The electrode 161c may be formed of, for example, a stack of Ti/Cu/Ti, Ag paste, and ITO.

The dielectric layer 161b may be formed of an inorganic material such as SiO2, SiNx, SiON, Al2O3, TiO2, HfO2, or the like. Alternatively, the dielectric layer 161b may be comprised of a single layer or a multi-layer as an organic insulator. The dielectric layer 161b may have a thickness of several tens of nm to several μm.

Furthermore, the board 161 according to the present disclosure includes a plurality of cells 161d separated by barrier ribs. The cells 161d are sequentially arranged in one direction and may be made of a polymer material. Also, the barrier ribs 161e defining the cells 161d are shared with the neighboring cells 161d. The barrier ribs 161e may protrude from the base portion 161a, and the cells 161d may be sequentially arranged along one direction by the barrier ribs 161e. More specifically, the cells 161d are sequentially arranged in the column and row directions, respectively, and may have a matrix structure.

As shown, the cell 161d may have a groove for accommodating the semiconductor light emitting diode 150 and the groove may be a space defined by the barrier ribs 161e. The shape of the groove may be the same as or similar to that of the semiconductor light emitting diode. For example, when the semiconductor light emitting diode has a rectangular shape, the groove may have a rectangular shape. Also, although not shown, when the semiconductor light emitting diode has a circular shape, the groove formed in the cells may have a circular shape. Furthermore, each of the cells is configured to accommodate a single semiconductor light emitting diode. That is, one semiconductor light emitting diode is accommodated in one cell.

Meanwhile, the plurality of electrodes 161c may include a plurality of electrode lines disposed at the bottom of each of the cells 161d, and the plurality of electrode lines may extend to adjacent cells.

The plurality of electrodes 161c are disposed below the cells 161d, and different polarities are applied to the electrodes 161c to generate an electric field in the cells 161d. To form the electric field, the dielectric layer may form the bottom of the cells 161d while the dielectric layer is covering the plurality of electrodes 161c. In this structure, when different polarities are applied to the pair of electrodes 161c under the cells 161d, an electric field is formed, and the semiconductor light emitting diodes may be inserted into the cells 161d due to the electric field.

In the assembly position, the electrodes of the board 161 are electrically connected to a power supply device 171. The power supply device 171 may apply power to the plurality of electrodes to generate the electric field.

As shown, the self-assembly apparatus may include a magnet 163 for applying a magnetic force to the semiconductor light emitting diodes. The magnet 163 is spaced apart from the fluid chamber 162 to apply a magnetic force to the semiconductor light emitting diodes 150. The magnet 163 may be disposed to face the opposite surface of the assembly surface of the board 161, and the position of the magnet is controlled by the position control unit 164 connected to the magnet 163.

The semiconductor light emitting diode 1050 may include a magnetic material to move in the fluid due to the magnetic field of the magnet 163.

Referring to FIG. 9, a semiconductor light emitting diode including a magnetic material may include a first conductivity type electrode 1052, a second conductivity type electrode 1056, a first conductivity type semiconductor layer 1053 on which the first conductivity type electrode 1052 is disposed, a second conductivity type semiconductor layer 1055 on which the second conductivity type electrode 1056 is disposed, the second conductivity type semiconductor layer 1055 overlapping the first conductivity type semiconductor layer 1052 and an active layer 1054 disposed between the first and second conductivity type semiconductor layers 1053 and 1055.

Here, the first conductivity type may be p-type, the second conductivity type may be n-type, and vice versa. In addition, as described above, the semiconductor light emitting diode having no active layer may be used.

Meanwhile, in the present disclosure, the first conductivity type electrode 1052 may be generated after the semiconductor light emitting diode is assembled to the wiring board through self-assembly of the semiconductor light emitting diode. Also, in the present disclosure, the second conductivity type electrode 1056 may include the magnetic material. The magnetic material may mean a magnetic metal. The magnetic material may be Ni, SmCo, or the like, and as another example, may include a material corresponding to at least one of Gd-based, La-based, and Mn-based materials.

The magnetic material may be provided in the second conductivity type electrode 1056 in the form of particles. Alternatively, the conductivity type electrode including a magnetic material may have one layer formed of a magnetic material. For this example, as shown in FIG. 9, the second conductivity type electrode 1056 of the semiconductor light emitting diode 1050 may include a first layer 1056a and a second layer 1056b. Here, the first layer 1056a may include a magnetic material, and the second layer 1056b may include a metal material rather than a magnetic material.

As shown, in this example, the first layer 1056a including a magnetic material may be disposed to contact the second conductivity type semiconductor layer 1055. In this case, the first layer 1056a is disposed between the second layer 1056b and the second conductivity type semiconductor layer 1055. The second layer 1056b may be a contact metal connected to the second electrode of the wiring board. However, the present disclosure is not necessarily limited thereto, and the magnetic material may be disposed on one surface of the first conductivity type semiconductor layer.

Referring back to FIGS. 6 and 7, more specifically, the self-assembly apparatus is provided with a magnet handler that is movable automatically or manually in the x, y, and z axes on the upper portion of the fluid chamber, or a motor capable of rotating the magnet 163. The magnet handler and the motor may constitute the position control unit 164. Through this, the magnet 163 may rotate in a horizontal direction with the board 161, clockwise or counterclockwise direction.

Meanwhile, a bottom plate 166 having a light-transmitting property may be formed in the fluid chamber 162, and the semiconductor light emitting diodes may be disposed between the bottom plate 166 and the board 161. An image sensor 167 may be disposed to face the bottom plate 166 to monitor the inside of the fluid chamber 162 through the bottom plate 166. The image sensor 167 is controlled by the control unit 172 and may include an inverted type lens, a CCD and the like to observe the assembly surface of the board 161.

The self-assembly apparatus described above is configured to use a combination of a magnetic field and an electric field, and when using this, the semiconductor light emitting diodes may be seated at predetermined positions on the board due to an electric field while moving by a change in the position of the magnet. Hereinafter, an assembly process using the self-assembly apparatus described above will be described in more detail.

First, a plurality of semiconductor light emitting diodes 1050 including a magnetic material are formed through the process described with reference to FIGS. 5a to 5c. In this case, in the process of forming the second conductivity type electrode of FIG. 5c, a magnetic material may be deposited on the semiconductor light emitting diode.

Next, the board 161 is transferred to an assembly position, and the semiconductor light emitting diodes 1050 are put into the fluid chamber 162 (FIG. 8a).

As described above, the assembly position of the board 161 may be a position in which the board 161 is to be disposed in the fluid chamber 162 such that the assembly surface of the board 161 on which the semiconductor light emitting diodes 1050 are to be assembled faces downward.

In this case, some of the semiconductor light emitting diodes 1050 may sink to the bottom of the fluid chamber 162 and some may float in the fluid. The bottom plate 166 having a light-transmitting property is provided in the fluid chamber 162, and some of the semiconductor light emitting diodes 1050 may sink to the bottom plate 166.

Next, a magnetic force is applied to the semiconductor light emitting diodes 1050 such that the semiconductor light emitting diodes 1050 vertically float in the fluid chamber 162 (FIG. 8b)

When the magnet 163 of the self-assembly apparatus moves from its original position to the opposite surface of the assembly surface of the board 161, the semiconductor light emitting diodes 1050 may float toward the board 161 in the fluid. The original position may be a position deviated from the fluid chamber 162. As another example, the magnet 163 may be made of an electromagnet. In this case, electricity is supplied to the electromagnet to generate an initial magnetic force.

Meanwhile, in this example, when the magnitude of the magnetic force is adjusted, the separation distance between the assembly surface of the board 161 and the semiconductor light emitting diodes 1050 may be controlled. For example, the separation distance is controlled using the weight, buoyancy, and magnetic force of the semiconductor light emitting diodes 1050. The separation distance may be several millimeters to several tens of micrometers from the outermost edge of the board.

Next, a magnetic force is applied to the semiconductor light emitting diodes 1050 such that the semiconductor light emitting diodes 1050 move in one direction in the fluid chamber 162. For example, it is possible to move the magnet 163 in a direction horizontal to the board, clockwise or counterclockwise (FIG. 8c). In this case, the semiconductor light emitting diodes 1050 move in a direction parallel to the board 161 from positions spaced apart from the board 161 due to the magnetic force.

Next, an electric field is applied to guide the semiconductor light emitting diodes 1050 to preset positions such that the semiconductor light emitting diodes 1050 are seated in the preset positions of the board 161 while the semiconductor light emitting diodes 1050 are moving (FIG. 8c). For example, while the semiconductor light emitting diodes 1050 are moving in a direction horizontal to the board 161, the semiconductor light emitting diodes 1050 may move in a direction perpendicular to the board 161 due to the electric field, and be then seated in the preset positions of the board 161.

More specifically, an electric field is generated by supplying power to the bi-planar electrode of the board 161 to enable assembly to be made only at preset positions. That is, the semiconductor light emitting diodes 1050 are self-assembled at assembly positions of the board 161 by using the selectively generated electric field. To this end, cells in which the semiconductor light emitting diodes 1050 are inserted may be provided in the board 161.

Thereafter, a process of unloading the board 161 is performed, and the assembly process is finished. When the board 161 is an assembly board, a post-process for realizing a display device by transferring the semiconductor light emitting diodes arranged as described above to a wiring board may be performed.

Meanwhile, after guiding the semiconductor light emitting diodes 1050 to the preset positions, the magnet 163 may be moved in a direction away from the board 161 such that the semiconductor light emitting diodes 1050 remaining in the fluid chamber 162 fall to the bottom of the fluid chamber 162 (FIG. 8d). As another example, when power supply is stopped in a case where the magnet 163 is an electromagnet, the semiconductor light emitting diodes 1050 remaining in the fluid chamber 162 may fall to the bottom of the fluid chamber 162.

Thereafter, when the semiconductor light emitting diodes 1050 at the bottom of the fluid chamber 162 are recovered, the recovered semiconductor light emitting diodes 1050 may be reused.

The self-assembly apparatus and method described above may use a magnetic field to enable distant parts to congregate near a predetermined assembly site and apply a separate electric field to the assembly site such that the parts are selectively assembled only to the assembly site in order to increase the assembly yield in fluidic assembly. In this case, the assembly board is placed on the upper portion of the water tank and the assembly surface is directed downward to minimize the effect of gravity due to the weight of the parts and prevent non-specific binding to eliminate defects. That is, to increase the transfer yield, the assembly board is placed on the upper portion to minimize the effect of gravity or frictional force, and to prevent non-specific binding.

As described above, according to the present disclosure having the above configuration, in a display device in which individual pixels are formed of semiconductor light emitting diodes, a large number of semiconductor light emitting diodes may be assembled at once.

As described above, according to the present disclosure, it is possible to pixelate a large amount of semiconductor light emitting diodes on a small-sized wafer and then transfer the semiconductor light emitting diodes to a large-area board. Through this, it is possible to manufacture a large-area display device at a low cost.

On the other hand, the present disclosure provides a structure and method for an assembly board for increasing the yield of the above-described self-assembly process and the process yield after self-assembly. The present disclosure is limited to a case where the board 161 is used as an assembly board.

That is, the assembly board, which will be described later, is not used as a wiring board of the display device. Accordingly, the board 161 will be referred to as an assembly board 161 hereinafter.

The present disclosure improves the process yield in two respects. First, according to the present disclosure, it is possible to prevent an electric field from occurring strongly at an unwanted position, and the semiconductor light emitting diode from being seated at an unwanted position. Second, according to the present disclosure, it is possible to prevent a semiconductor light emitting diode from remaining on the assembly board when semiconductor light emitting diodes seated on the assembly board are transferred to another board.

The present disclosure may suggest a different type of self-assembly method from the aforementioned self-assembly method using electric field and magnetic field (FIGS. 8a to 8e).

According to the self-assembly method described above, the semiconductor light emitting diodes 1050 randomly injected into the fluid may form a dummy comprised of a plurality of semiconductor light emitting diodes 1050 and move together along the movement direction of magnetic field. In the process of movement, some semiconductor light emitting diodes 1050 are seated inside in cells 161d by being attracted to an electric field strongly formed inside the cell 161d.

That is, since the direction of movement of the semiconductor light emitting diodes 1050 is determined by the magnetic field in the self-assembly method described above, the semiconductor light emitting diodes 1050 may be assembled in all cells 161d at the same time, or a specific semiconductor light emitting diode 1050 could not be assembled in a specific cell 161d.

The present disclosure relates to a board-to-board self-assembly method, wherein the semiconductor light emitting diodes 1100 provided on a first board are simultaneously transferred to a second board, and intervals between the semiconductor light emitting diodes are constantly maintained on the first board and the second board.

Here, the first board is a donor board for providing the semiconductor light emitting diodes 1100, which may be a temporary board 2000, and the second board is an acceptor board for accommodating the semiconductor light emitting diodes 1100, which may be a wiring board 3000 or an assembly board 4000. A detailed description of each board will be described later.

FIG. 10 is a view schematically showing a self-assembly process according to the present disclosure, and the self-assembly process according to the present disclosure may largely include the following operations.

First, as shown in FIGS. 10(a) and 10(b), after bonding a growth substrate 1000 on which semiconductor light emitting diodes 1100 are formed at predetermined intervals, and a temporary board 2000 on which a sacrificial layer 2100 etched in a fluid is formed, an operation of transferring the semiconductor light emitting diodes 1100 formed on the growth substrate 1000 to the temporary board 2000 may be performed.

Specifically, one surface of the growth substrate 1000 on which the semiconductor light emitting elements 1100 are formed and one surface of the temporary board 2000 on which the sacrificial layer 2100 is formed are pressed together to transfer the semiconductor light emitting diodes 1100 from the growth substrate 1000 to the sacrificial layer 2100 of the temporary board 2000 and the intervals between the semiconductor light emitting diodes 1100 may be maintained equally.

In addition, the sacrificial layer 2100 may be formed of a material having superior adhesion or bonding strength compared to the growth substrate 1000, whereby the semiconductor light emitting diodes 1100 formed on the growth substrate 1000 may be easily transferred to the temporary board 2000.

Next, as shown in FIG. 10(c), operation of putting the acceptor board on which cells in which the semiconductor light emitting diodes 1100 are seated are formed at predetermined intervals into fluid L, putting the temporary board 2000 into to the fluid and aligning the temporary board 2000 with respect to the acceptor board may be performed.

In this case, the temporary board 2000 may be aligned in a fluid such that the sacrificial layer 2100, to which the semiconductor light emitting diodes 1100 transferred from the growth substrate 1000 are fixed, faces the acceptor board, and one surface of the acceptor board facing the sacrificial layer 2100 may be a surface on which the cells, in which the semiconductor light emitting diodes 1100 are to be mounted, are formed.

Also, at least the semiconductor light emitting diodes 1100 fixed to the temporary board 2000 may be aligned to face the cells formed in the acceptor board. In other words, some cells may not face the semiconductor light emitting diodes 1100, but at least all of the semiconductor light emitting diodes 1100 fixed to the temporary board 2000 may be aligned to face the cells.

In addition, it is preferable that the temporary board 2000 and the acceptor board are aligned so as not to contact each other while maintaining as close to each other as possible in the fluid.

Next, as shown in FIG. 10(d), operation of applying power to at least one of the temporary board 2000 and the acceptor board to form an electric field for moving the semiconductor light emitting diodes 1100 may be performed.

The power may be applied to both the temporary board 2000 and the acceptor board (to form an electric field in a vertical direction), or may be applied to only the acceptor board (to form an electric field in a horizontal direction). The structure of the temporary board 2000 and the type of the acceptor board may vary according to each case, and details related thereto will be described later.

Finally, as shown in FIG. 10(e), operation of placing the semiconductor light emitting diodes 1100 separated from the temporary board 2000 in the cells formed in the acceptor board may be performed.

The semiconductor light emitting diodes 1100 may be separated from the temporary board 2000 as the sacrificial layer 2100 to which the semiconductor light emitting diodes 1100 are fixed is etched in the fluid, and may be subjected to a dielectrophoretic force due to the formed electric field to be moved from the temporary board 2000 toward the acceptor board and then seated in the facing cells.

In addition, since the temporary board 2000 and the acceptor board are arranged to be as close as possible to each other, the semiconductor light emitting diodes 1100 may be seated on the acceptor board while maintaining the same intervals as the intervals at which they are fixed to the temporary board 2000.

Next, various embodiments of the temporary board 2000 will be described with reference to FIGS. 14 and 15.

FIGS. 14a to 14d are diagrams showing a structure of a temporary board according to embodiments of the present disclosure, and FIG. 15 is a diagram showing a self-assembly process using the temporary board according to FIG. 14d.

The temporary board 2000 may be a board onto which the semiconductor light emitting diodes 1100 formed on the growth substrate 1000 are pressed and transferred before self-assembly. The semiconductor light emitting diodes 1100 may be temporarily fixed to the sacrificial layer 2100 formed on one surface of the temporary board 2000, and the sacrificial layer 2100 is etched in a fluid in which self-assembly is performed, so that the semiconductor light emitting diodes 1100 may be separated from the temporary board 2000.

That is, the temporary board 2000 may necessarily include the sacrificial layer 2100 for self-assembly according to an embodiment of the present disclosure, and the sacrificial layer 2100 may be formed of a polymer material having an adhesive force to fix the semiconductor light emitting diodes 1100, the sacrificial layer 2100 being etched in the fluid.

For example, the sacrificial layer 2100 may be solvent type adhesives such as propylene-butene (butylene) copolymers, PVC cement, solvent type acrylic adhesives, solvent soluble polyimide, or the like.

In this case, as the fluid L, acetone, isopropyl alcohol (IPA) capable of etching the sacrificial layer 2100, or the like may be used.

Meanwhile, although the sacrificial layer 2100 formed of the above-described material is etched entirely in the fluid, it is also possible to configure only a portion of the sacrificial layer 2100 to be selectively etched in the fluid.

To this end, the sacrificial layer 2100 may be formed of a photosensitive material, and only a partial portion thereof may be subjected to exposure (projection-type photolithography). As shown in FIG. 14d, the sacrificial layer 2100 may include an exposed region 2100a and a non-exposed region 2100b through an exposure process, and a developer capable of etching only the exposed region 2100a may be used as the fluid L, thus selectively etching the sacrificial layer 2100.

In this case, at least some of the semiconductor light emitting diodes 1100 fixed to the temporary board 2000 are fixed to the exposed region 2100a, so that only some semiconductor light emitting diodes 1100 may be selectively separated from the temporary board 2000 as the exposed region 2100a is etched in the fluid L.

In another embodiment for selective separation, the temporary board 2000 may include an auxiliary bonding layer 2300 formed of a photosensitive material under the sacrificial layer 2100 (FIG. 14c). In this case, the sacrificial layer 2100 may be formed of any of the solvent-type adhesive materials described above.

In this case, through the above-described exposure process, the auxiliary bonding layer 2300 may include an exposed region 2300a and a non-exposed region 2300b, and only the exposed region 2300a may be selectively etched by the developer.

When exposure is performed on the auxiliary bonding layer 2300, the bonding force between the sacrificial layer 2100 and the semiconductor light emitting diodes 1100 may be maintained for a long time.

In the case of using the structure of the temporary board 2000 including the auxiliary bonding layer 2300, an isolation process is performed on the area of the sacrificial layer 2100 to which the semiconductor light emitting diodes 1100 are not fixed before the exposure process. That is, the sacrificial layer 2100 may be etched in areas between the semiconductor light emitting diodes 1100, so that the auxiliary bonding layer 2300 formed under the sacrificial layer 2100 may be exposed.

In addition, in order to remove some of the sacrificial layer 2100 remaining on one surface of the semiconductor light emitting diodes 1100 after self-assembly, a process of replacing the fluid L with acetone or isopropyl alcohol in the developer may be performed.

Meanwhile, the temporary board 2000 may include a third assembly electrode 2200 for forming an electric field under the sacrificial layer 2100 according to the type of the acceptor board (FIG. 14b).

The third assembly electrode 2200 may form an electric field that moves the semiconductor light emitting diodes in cooperation with an assembly electrode formed on the acceptor board when power is applied. In this case, the power applied to form the electric field may be a voltage.

In addition, the third assembly electrode 2200 may be made of a transparent conductive material to align the temporary board 2000 such that the semiconductor light emitting diodes 1100 formed on the temporary board 2000 face cells formed in the acceptor board.

The temporary board 2000 including the third assembly electrode 2200 may be used when acceptor board is a wiring board 3000, which will be described later.

FIG. 11 is a view showing sub-pixels on an acceptor board and arrangement of the pixels according to an embodiment of the present disclosure.

According to the present disclosure, the acceptor board may be made only of the semiconductor light emitting diodes 1100 emitting the same color, but be preferably made of two or more semiconductor light emitting diodes 1100 emitting different colors which are assembled thereto.

Specifically, the semiconductor light emitting diodes 1100 used for self-assembly of the present disclosure may include a blue semiconductor light that emitting diode (hereinafter, referred to as a BLUE chip) that emits blue light, a green semiconductor light emitting diode that emits green light (hereinafter, referred to as a GREEN chip) and a red semiconductor light emitting diode that emits red light (hereinafter, referred to as a RED chip).

The BLUE chip, the GREEN chip, and the RED chip are grown on different growth substrates 1000, respectively, transferred to different temporary boards 2000, subjected to the self-assembly method described above, and finally assembled on the acceptor board.

For example, sub-pixels may be assembled on the acceptor board in arrangement of a matrix form, and as shown in FIG. 11, a unit pixel may be comprised of four adjacent sub-pixels RGBR (2×2). Alternatively, the unit pixel may be comprised of three sub-pixels RGB.

The self-assembly according to the present disclosure may use the wiring board 3000 or the assembly board 4000 as the acceptor board. Hereinafter, a process of manufacturing the semiconductor light emitting diodes 1100 and fixing the semiconductor light emitting diodes 1100 to a temporary board will be described as a pre-process of self-assembly and cases of respectively using the wiring board 3000 and the assembly board 4000 as the acceptor board will be then described.

FIG. 17 is a view showing operations including operation of manufacturing semiconductor light emitting diodes to operation of transferring the semiconductor light emitting diodes to a temporary board as a pre-process of the self-assembly process according to an embodiment of the present disclosure.

The pre-process of self-assembly according to FIG. 17 may be equally applied regardless of types of the acceptor board.

First, an operation of growing a plurality of semiconductor layers constituting the semiconductor light emitting diodes 1100 on the growth substrate 1000 is performed. The BLUE chip and the GREEN chip may be formed by a nitride-based semiconductor growth method, and the RED chip may be formed by a phosphide-based semiconductor growth method.

Specifically, in the case of the BLUE chip and the GREEN chip, a first conductivity-type semiconductor layer (hereinafter, referred to as an n-type semiconductor layer) 1110, an active layer 1120, and a second conductivity-type semiconductor layer (hereinafter, referred to as a p-type semiconductor layer) 1130 are sequentially stacked on a sapphire growth substrate 1000 (FIG. 17a), and a second conductivity-type electrode layer (hereinafter, referred to as a p-type electrode layer) 1140 for forming ohmic contact is deposited (FIG. 17b).

In the case of the RED chip, an n-type semiconductor layer 1110, an active layer 1120, and a p-type semiconductor layer 1130 are sequentially stacked on a GaAs growth substrate 1000, and a p-type electrode layer 1140 may be deposited.

For example, the p-type electrode layer 1140 may be a transparent electrode layer such as indium tin oxide (ITO) or a metal electrode layer. The transparent electrode layer may be manufactured through sputtering and etching processes, and the metal electrode layer may be manufactured through E-beam deposition and lift-off processes.

Next, a current injection region is formed on the p-type semiconductor layer 1130 through a photolithography patterning and etching process (FIG. 17c). There are a method for etching only a part of the surface of the p-type semiconductor layer 1130 or only a part of the active layer 1120 such the side of the active layer 1120 is not exposed as much as possible, and a method for performing etching such that a part of the n-type semiconductor layer 1110 is exposed. The process for forming the current injection region is to prepare for a decrease in radiative efficiency due to a surface non-radiative recombination phenomenon, which may be omitted.

Next, a passivation layer 1160 may be formed on the surface of the p-type semiconductor layer 1130 in which the current injection region is formed (FIG. 17d). The passivation layer 1160 may be formed by depositing an insulating film made of $SiO_2$ or $SiN_x$. The operation of forming the passivation layer 1160 may be included or omitted depending on whether power is applied to the temporary board 2000 in a subsequent self-assembly process.

Thereafter, the growth substrate 1000 on which the plurality of semiconductor layers and the passivation layer 1160 described above are formed and the temporary board 2000 on which the third assembly electrode 2200 and the sacrificial layer 2100 are deposited are bonded to each other (FIG. 17e). Specifically, the passivation layer 1160 of the growth substrate 1000 and the sacrificial layer 2100 of the temporary board 2000 may be bonded in contact with each other.

In this case, since the third assembly electrode 2200 formed on the temporary board 2000 need to be subjected to optical image alignment such that a semiconductor light emitting diode 1100 faces a cell of the acceptor board, the third assembly electrode may be formed of a transparent conductive material (e.g., ITO).

In addition, the sacrificial layer 2100 is formed of a polymer material that can be easily etched by a fluid of a specific component while having a relatively strong bonding force at about 100° C. (glass transition temperature, Tg) at which bonding is performed.

Next, separating the growth substrate 1000 is performed through the laser lift-off (LLO) or chemical lift-off (CLO) technology (FIG. 17f), and thinning the thickness of the n-type semiconductor layer 1110 is performed (about 5 to 10 μm thick) by etching the entire surface of the n-type semiconductor layer 1110 exposed as the growth substrate 1000 is separated (FIG. 17g).

After depositing a transparent conductor such as ITO on the n-type semiconductor layer 1110, a process of performing patterning such that the n-type electrode layer 1150 for ohmic contact is located at a position coincident with the current injection region (FIG. 17h) and then manufacturing the semiconductor light emitting diodes 1100 may be completed by performing isolation etching (FIG. 17i), and in this state, the self-assembly process to be described later may be performed.

FIGS. 12a to 12c are views showing a self-assembly process according to an embodiment (wiring board) of the present disclosure, FIGS. 13a to 13c are a self-assembly process according to another embodiment (assembly board) of the present disclosure, and FIG. 16 is a view showing the assembly electrode formed on the assembly board according to an embodiment of the present disclosure.

First, a case in which the wiring board 3000 is used as an acceptor board according to an embodiment of the present disclosure will be described.

The wiring board 3000 is a board on which a driving electrode 3100 for driving the semiconductor light emitting diodes 1100 is formed, and may be a board used as a final display panel.

Referring to FIGS. 12a to 12c, when the acceptor board is the wiring board 3000, power may be simultaneously applied to the temporary board 2000 and the wiring board 3000 such that an electric field is formed in the vertical direction. For example, the applied power may be a voltage, and voltages of different polarities may be applied to the temporary board 2000 and the wiring board 3000.

Accordingly, both the temporary board 2000 and the wiring board 3000 may include assembly electrodes for forming an electric field. For example, the temporary board 2000 including the third assembly electrode 2200 may be used as the temporary board 2000 (FIG. 14b), and the wiring board 3000 may include a first assembly electrode or a second assembly electrode. Alternatively, a driving electrode 3100 formed on the wiring board 3000 may perform the function of a first assembly electrode or a second assembly electrode.

Here, the first assembly electrode and the second assembly electrode may be classified according to the polarity of the applied voltage, for example, a voltage of + polarity is applied to the first assembly electrode, and a voltage of − polarity may be applied.

When the acceptor board is the wiring board 3000, power is simultaneously applied to the third assembly electrode 2200 of the temporary board 2000 and the driving electrode 3100 of the wiring board 3000 to form an electric field in a vertical direction in a space between the temporary board 2000 and the wiring board 3000 form the temporary board 2000 and the semiconductor light emitting diodes 1100 fixed to the temporary board 2000 are seated on the wiring board 3000 due to a dielectrophoretic force as the sacrificial layer 2100 is separated therefrom.

Meanwhile, in order to assemble all of the RED chip, the GREEN chip, and the BLUE chip on the wiring board 3000 as shown in FIGS. 12a to 12c, operation of assembling the RED chip, operation of assembling the GREEN chip, and operation of assembling the BLUE chip may be performed.

The order of operations may be arbitrarily changed, and in the present specification, performing assembling in the order of the RED chip—the GREEN chip—the BLUE chip will be taken as an example.

First, self-assembly is performed using the wiring board 3000 and the temporary board 2000 on which the RED chips are formed at predetermined intervals, and then self-assembly is performed using the wiring board 3000 and the temporary board 2000 on which the GREEN and BLUE chips are formed in the same manner at predetermined intervals, In this case, after the chips formed on the temporary board 2000 are aligned to face the cells 3200 on which the chips are to be seated on the wiring board 3000, self-assembly may be performed.

In particular, GREEN chips may be arranged to face cells in which RED chips are not seated, and BLUE chips may be arranged to face cells in which RED chips and GREEN chips are not seated.

Meanwhile, when the transfer of the semiconductor light emitting diodes 1100 fixed to one temporary board 2000 is completed, an operation of discharging the fluid L toward the acceptor board may be performed.

For example, when all of the RED chips fixed to the temporary board 2000 are transferred to the wiring board 3000 as shown in FIG. 12a, the fluid L is discharged under of the wiring board 3000, and a new fluid L for assembly of the GREEN chips may be injected back, and when the operation of transferring the GREEN chips is completed as shown in FIG. 12b, the fluid L is discharged again and a new fluid (L) for assembling the BLUE chips may be injected.

In this case, the fixing force of the semiconductor light emitting diodes 1100 assembled on the acceptor board may be improved by the adhesive component of the sacrificial layer 2100 dissolved in the fluid L.

FIG. 18 is a view showing a post-process of the self-assembly process according to an embodiment of the present disclosure.

According to an embodiment of the present disclosure, a part of the driving electrode 3100 may be exposed on the bottom surface of the cells 3200 formed on the wiring board 3000, and electrically connected to the semiconductor light emitting diodes 1100, and a part of the driving electrode 3100 may be a metal solder.

Specifically, when self-assembly is completed, after discharging the fluid L in a state in which an electric field is applied, heat and pressure may be applied to bond the n-type electrode layer 1150 of the semiconductor light emitting diode 1100 and the driving electrode 3100 to each other (FIG. 18a). In this case, the n-type electrode layer 1150 is not necessarily a transparent electrode layer.

Next, the passivation layer 3300 is formed on the wiring board 3000 and the planarization layer 3400 is formed to cover the passivation layer 3300 while filling the gap between sub-pixels, and an AM-type transparent driving electrode 3500 connected to the p-type electrode layer 1140 may be formed (FIGS. 18b to 18d).

Next, a case in which the assembly board 4000 is used as the acceptor board according to another embodiment of the present disclosure will be described.

The assembly board 4000 may be a board used to temporarily accommodate the semiconductor light emitting diodes 1100 during self-assembly. Accordingly, an operation for transfer to the wiring board 3000 may be further performed as a post-process of self-assembly.

Referring to FIGS. 13a to 13c, when the acceptor board is the assembly board 4000, power is applied to the assembly board 4000, so that an electric field may be formed in the vicinity of the assembly board 4000 in a horizontal direction. For example, the applied power may be a voltage, and the assembly board 4000 may include a first assembly electrode 4100 and a second assembly electrode 4200 to which voltages of different polarities are applied respectively.

The first assembly electrode 4100 and the second assembly electrode 4200 may be formed to be parallel to each other, and the first assembly electrode 4100 and the second assembly electrode 4200 may be alternately disposed. In this case, the cells 4300 in which the semiconductor light emitting diodes 1100 are seated overlap the first assembly electrode 4100 and the second assembly electrode 4200, so that an electric field is formed inside the cell 4300 when power is applied.

The semiconductor light emitting diodes 1100 fixed to the temporary board 2000 may be seated on the assembly board 4000 by a dielectrophoretic force as the sacrificial layer 2100 is separated. Since the assembly process is the same as that of the case in which the wiring board 3000 is used as an acceptor board, a detailed description thereof will be omitted.

On the other hand, in the process of discharging the fluid L to the acceptor board, that is, the assembly board 4000 in this embodiment, after the self-assembly to the one temporary board 2000 is completed as described above, the adhesive component of the sacrificial layer 2100 dissolved in the fluid L may improve a fixing force of the semiconductor light emitting diodes 1100 to the assembly board 4000. Accordingly, in the process of transferring the semiconductor light emitting diodes 1100 seated on the assembly board 4000 to the wiring board 3000, it is possible to prevent the semiconductor light emitting diodes 1100 from being separated from the surface of the assembly board 4000.

Alternatively, when the acceptor board is the assembly board 4000, an operation of applying an adhesive material 4400 to the assembly board 4000 after the transfer of the semiconductor light emitting diodes 1100 fixed to the temporary board 2000 is completed may be optionally included. The fixing force of the semiconductor light emitting diodes 1100 to the surface of the assembly board 4000 may be improved by the applied adhesive material 4400.

FIG. 19 is a view showing a post-process of a self-assembly process according to another embodiment of the present disclosure.

According to another embodiment of the present disclosure, the semiconductor light emitting diodes 1100 are temporarily seated on the assembly board 400, and then transferred from the assembly board 4000 to the wiring board 3000 according to FIG. 18.

Referring to FIG. 19, an operation of applying the adhesive material 4400 to the assembly board 400 to prevent separation of the semiconductor light emitting diodes 1100 seated on the assembly board 400 may be previously performed, whereby the semiconductor light emitting diodes 1100 may be stably transferred to the wiring board 3000. The semiconductor light emitting diodes 1100 seated on the assembly board 4000 may be transferred to the wiring board 3000 by compression, and after the semiconductor light emitting diodes 1100 are transferred to the wiring board 3000, the same post-process as shown in FIG. 18 may be performed.

However, in the present embodiment, the semiconductor light emitting diode 1100 is mounted on the wiring board 3000 through the assembly board 4000, and the electrode layer 1100 of the semiconductor light emitting diode connected to the driving electrode 3100 of the wiring board 3000 may be the p-type electrode layer 1140.

As described above, in the method of manufacturing a display device according to an embodiment of the present disclosure, the semiconductor light emitting diodes 1100 formed on the temporary board 200 are transferred to the acceptor board while maintaining intervals, thus making it possible to place a specific semiconductor light emitting diode 1100 in a cell at a specific position through alignment of the board 2000 and the acceptor board.

In addition, since the self-assembly of the semiconductor light emitting diodes 1100 formed on the temporary board 2000 proceeds at the same time, the efficiency of the process can be improved, and the movement distance of the semiconductor light emitting diodes 1100 is minimized to prepare for the loss or damage of the semiconductor light emitting semiconductor diodes 1100.

The above-described present disclosure is not limited to the configuration and method of the above-described embodiments, but the embodiments may be configured by selectively combining all or part of each embodiment such that various modifications can be made.

The invention claimed is:

1. A method for manufacturing a display device, the method comprising:
    transferring semiconductor light emitting diodes (LEDs) disposed on a growth substrate to a temporary board by bonding the growth substrate and the temporary board, wherein the semiconductor LEDs are disposed at predetermined intervals on the growth substrate and a sacrificial layer to be etched in a fluid is disposed on the temporary board;
    placing an acceptor board in the fluid, wherein cells on which the semiconductor LEDs are to be seated are disposed at predetermined intervals on the acceptor board;
    aligning the temporary board in the fluid such that the sacrificial layer faces the acceptor board;
    forming an electric field for moving the semiconductor LEDs by applying power to at least one of the temporary board or the acceptor board; and
    placing the semiconductor LEDs separated from the temporary board in the cells disposed in the acceptor board, wherein the semiconductor LEDs are seated on the acceptor board while maintaining same intervals as the predetermined intervals disposed on the growth substrate.

2. The method according to claim 1, wherein at least the semiconductor LEDs coupled to the temporary board are aligned to face the cells disposed in the acceptor board.

3. The method according to claim 1, wherein the acceptor board comprises at least one of a first assembly electrode or a second assembly electrode that forms an electric field when power is applied, wherein the acceptor board is an assembly board or a wiring board, wherein the assembly board temporarily accommodates the semiconductor LEDs, and wherein a driving electrode for driving the semiconductor LEDs is disposed on the wiring board.

4. The method according to claim 3, wherein the temporary board comprises a third assembly electrode that forms an electric field for moving the semiconductor LEDs in cooperation with a first assembly electrode or a second assembly electrode from the acceptor board when power is applied,
    wherein the third assembly electrode comprises a transparent conductive material.

5. The method according to claim 3, wherein the first assembly electrode is parallel to the second assembly electrode.

6. The method according to claim 3, wherein the driving electrode comprises a metal solder electrically connected to the semiconductor LEDs, and
    wherein the wiring board comprises at least a portion of the metal solder exposed to a bottom surface of the cells.

7. The method according to claim 3, further comprising:
    selectively applying an adhesive material to the assembly board after transferring the semiconductor LEDs coupled to the temporary board based on the acceptor board corresponding to the assembly board.

8. The method according to claim 1, wherein the temporary board comprises an auxiliary bonding layer comprising a photosensitive material under the sacrificial layer.

9. The method according to claim 1, wherein the sacrificial layer comprises an exposed region that comprises a photosensitive material and that is etched in the fluid and a non-exposed region that is not etched in the fluid, and
    wherein at least some semiconductor LEDs are coupled to the exposed region.

10. The method according to claim 1, further comprising:
    discharging the fluid to a side where the acceptor board is disposed after transferring the semiconductor LEDs coupled to the temporary board is completed.

11. The method according to claim 1, wherein the semiconductor LEDs comprises a blue semiconductor LED configured to emit blue light, a green semiconductor LED configured to emit green light, and a red semiconductor LED configured to emit red light.

* * * * *